US012764941B2

(12) United States Patent
Lee et al.

(10) Patent No.: US 12,764,941 B2
(45) Date of Patent: Oct. 13, 2026

(54) THREE-DIMENSIONAL SEMICONDUCTOR MEMORY DEVICE

(71) Applicant: Samsung Electronics Co., Ltd., Suwon-si (KR)

(72) Inventors: Sangho Lee, Suwon-si (KR); Moonyoung Jeong, Suwon-si (KR); Sihyun Kim, Suwon-si (KR); Yoongi Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 470 days.

(21) Appl. No.: 18/528,854

(22) Filed: Dec. 5, 2023

(65) Prior Publication Data

US 2024/0357800 A1 Oct. 24, 2024

(30) Foreign Application Priority Data

Apr. 20, 2023 (KR) ........................ 10-2023-0052030

(51) Int. Cl.
*H10B 12/00* (2023.01)

(52) U.S. Cl.
CPC ......... *H10B 12/482* (2023.02); *H10B 12/485* (2023.02); *H10B 12/488* (2023.02)

(58) Field of Classification Search
CPC .. H10B 12/482; H10B 12/485; H10B 12/488; H10B 12/05; H10B 12/30; H10B 12/00;
(Continued)

(56) References Cited

U.S. PATENT DOCUMENTS 11,222,690 B2 1/2022 Karda et al.
11,825,642 B1 * 11/2023 Dai ........................ H10B 12/05
(Continued)

FOREIGN PATENT DOCUMENTS

CN 114792735 A 7/2022
CN 115513209 A 12/2022
KR 10-2022-0120006 A 8/2022

OTHER PUBLICATIONS

Belmonte, A., et al., "Capacitor-less, Long-Retention (>400s) DRAM Cell Paving the Way towards Low-Power and High-Density Monolithic 3D DRAM", 2020 IEEE International Electron Devices Meeting (IEDM).

*Primary Examiner* — Dao H Nguyen
(74) *Attorney, Agent, or Firm* — Wolf, Greenfield & Sacks, P.C.

(57) ABSTRACT

A semiconductor device includes a first bit line extending in a first direction, a first semiconductor pattern extending in a second direction and including first and second ends opposite to each other, the first end of the first semiconductor pattern being in contact with the first bit line, a first word line on the first semiconductor pattern and extending in a third direction, a selection line adjacent to the second end of the first semiconductor pattern and parallel to the third direction, a second semiconductor pattern interposed between the selection line and the first semiconductor pattern and having first end and second ends opposite to each other, a second bit line extending in the first direction and in contact with the first end of the second semiconductor pattern, and a source line extending in the first direction and in contact with the second end of the second semiconductor pattern.

20 Claims, 33 Drawing Sheets

(58) Field of Classification Search
CPC ........ H10B 12/01; H10B 12/50; H10B 99/22; H10D 84/83
See application file for complete search history.

(56) References Cited

U.S. PATENT DOCUMENTS

| | | | | |
|---|---|---|---|---|
| 2020/0279601 | A1* | 9/2020 | Kim | G11C 11/4097 |
| 2021/0151437 | A1 | 5/2021 | Tomishima | |
| 2022/0271040 | A1* | 8/2022 | Kim | H10B 12/05 |
| 2022/0392901 | A1* | 12/2022 | Liu | H10B 99/10 |
| 2024/0188280 | A1* | 6/2024 | Karda | H10B 12/00 |
| 2026/0020214 | A1* | 1/2026 | Karda | H10B 12/00 |

* cited by examiner

108

THREE-DIMENSIONAL SEMICONDUCTOR MEMORY DEVICE

CROSS-REFERENCE TO RELATED APPLICATION(S)

This U.S. non-provisional patent application claims priority under 35 U.S.C. § 119 to Korean Patent Application No. 10-2023-0052030, filed on Apr. 20, 2023, in the Korean Intellectual Property Office, the disclosure of which is hereby incorporated by reference in its entirety.

BACKGROUND OF THE INVENTION

The present disclosure relates to a three-dimensional semiconductor memory device.

Semiconductor devices are widely used in an electronic industry because of their small size, multi-function, and/or low manufacturing costs. The semiconductor devices have been highly integrated with the development of the electronic industry. Widths and spaces of patterns of the semiconductor devices have decreased for the high integration of the semiconductor devices. However, new exposure techniques and/or very expensive exposure techniques may be used to form fine patterns such that it might be difficult to highly integrate the semiconductor devices. Thus, various research has been conducted for new integration techniques.

SUMMARY

An object of the present disclosure is to provide a high-capacity, highly integrated three-dimensional semiconductor memory device.

A three-dimensional semiconductor memory device according to some embodiments of the present invention includes a first bit line extending in (e.g., extending longitudinally in) a first direction perpendicular to an upper surface of a substrate, a first semiconductor pattern extending in (e.g., extending longitudinally in) a second direction parallel to the upper surface of the substrate and comprising a first end and a second end opposite to each other, the first end of the first semiconductor pattern being in contact with the first bit line, a first word line on a middle portion (e.g., a center) of the first semiconductor pattern and extending in (e.g., extending longitudinally in) a third direction crossing the second direction and parallel to the upper surface of the substrate, a selection line adjacent to the second end of the first semiconductor pattern and parallel to the third direction, a second semiconductor pattern interposed between the selection line and the first semiconductor pattern and comprising a first end and a second end opposite to each other, a second bit line extending in (e.g., extending longitudinally in) the first direction and being in contact with the first end of the second semiconductor pattern, and a source line extending in (e.g., extending longitudinally in) the first direction and being in contact with the second end of the second semiconductor pattern.

A three-dimensional semiconductor memory device according to some embodiments of the present invention includes a first bit line extending in (e.g., extending longitudinally in) a first direction perpendicular to an upper surface of a substrate, first and second semiconductor patterns being in contact with a side surface of the first bit line, being spaced apart from each other in the first direction, and extending in (e.g., extending longitudinally in) a second direction parallel to the upper surface of the substrate, each of the first and second semiconductor patterns comprising a first end in contact with the first bit line and a second end opposite to the first end, a first word line adjacent to an upper surface of the first semiconductor pattern and extending in (e.g., extending longitudinally in) a third direction crossing the first and second directions, a second word line adjacent to an upper surface of the second semiconductor pattern and extending in (e.g., extending longitudinally in) the third direction, a first selection line adjacent to the second end of the first semiconductor pattern and extending in (e.g., extending longitudinally in) the third direction, a second selection line adjacent to the second end of the second semiconductor pattern and extending in the third direction, a third semiconductor pattern interposed between the first semiconductor pattern and the first selection line, a fourth semiconductor pattern interposed between the second semiconductor pattern and the second selection line, a source line extending in (e.g., extending longitudinally in) the first direction and in contact with one ends of the third and fourth semiconductor patterns, and a second bit line in contact with the other ends of the third and fourth semiconductor patterns and extending in (e.g., extending longitudinally in) the first direction.

A three-dimensional semiconductor memory device according to some embodiments of the present invention includes a first bit line extending in (e.g., extending longitudinally in) a first direction perpendicular to an upper surface of a substrate, a first semiconductor pattern extending in (e.g., extending longitudinally in) a second direction parallel to the upper surface of the substrate and comprising a first end and a second end opposite to each other, the first end of the first semiconductor pattern being in contact with the first bit line, a first word line disposed on a middle portion (e.g., a center) of the first semiconductor pattern and extending in (e.g., extending longitudinally in) a third direction crossing the second direction and parallel to the upper surface of the substrate, a selection line adjacent to the second end of the first semiconductor pattern and parallel to the third direction, a second semiconductor pattern interposed between the selection line and the first semiconductor pattern and comprising first and second ends opposite to each other, a second bit line extending in (e.g., extending longitudinally in) the first direction and in contact with the first end of the second semiconductor pattern, and a source line in contact with the second end of the second semiconductor pattern and extending in the first direction, wherein the first bit line, the first semiconductor pattern, the first word line, the third semiconductor pattern, the second bit line, and the source line constitute a first structure, and the first structure is provided in two, and the first structures are disposed in mirror symmetry with respect to the selection line.

A three-dimensional semiconductor memory device according to some embodiments of the present invention includes a first bit line disposed on a substrate and extending in (e.g., extending longitudinally in) a first direction, a first semiconductor pattern extending in (e.g., extending longitudinally in) a second direction parallel to an upper surface of the substrate and comprising a first end and a second end opposite to each other, the first end of the first semiconductor pattern being in contact with the first bit line, a first word line adjacent to the first semiconductor pattern and extending in (e.g., extending longitudinally in) a third direction crossing the first and second directions, a selection line adjacent to the second end of the first semiconductor pattern and parallel to the third direction, a second semiconductor pattern interposed between the selection line and the first semiconductor pattern and comprising first and second ends opposite to each other, a second bit line extending (e.g., extending longitudinally in) in the first direction and in contact with the first end of the second semiconductor pattern, and a source line extending in (e.g., extending longitudinally in) the first direction and in contact with the second end of the second semiconductor pattern.

BRIEF DESCRIPTION OF THE DRAWINGS

Example embodiments will be more clearly understood from the following descriptions taken in conjunction with the accompanying drawings. The accompanying drawings represent non-limiting, example embodiments as described herein.

DETAILED DESCRIPTION

Hereinafter, to explain the present invention in more detail, some example embodiments according to the present invention will be described in more detail with reference to the accompanying drawings. In this specification, a "word line" may be referred to as a "first conductive line" and a "first bit line" may also be referred to as a "second conductive line". A "second bit line" may be referred to as a "third conductive line", and a "selection line" may be referred to as a "fourth conductive line". An "end", "end portion" or a "terminal" may be used interchangeably.

Figure 1:
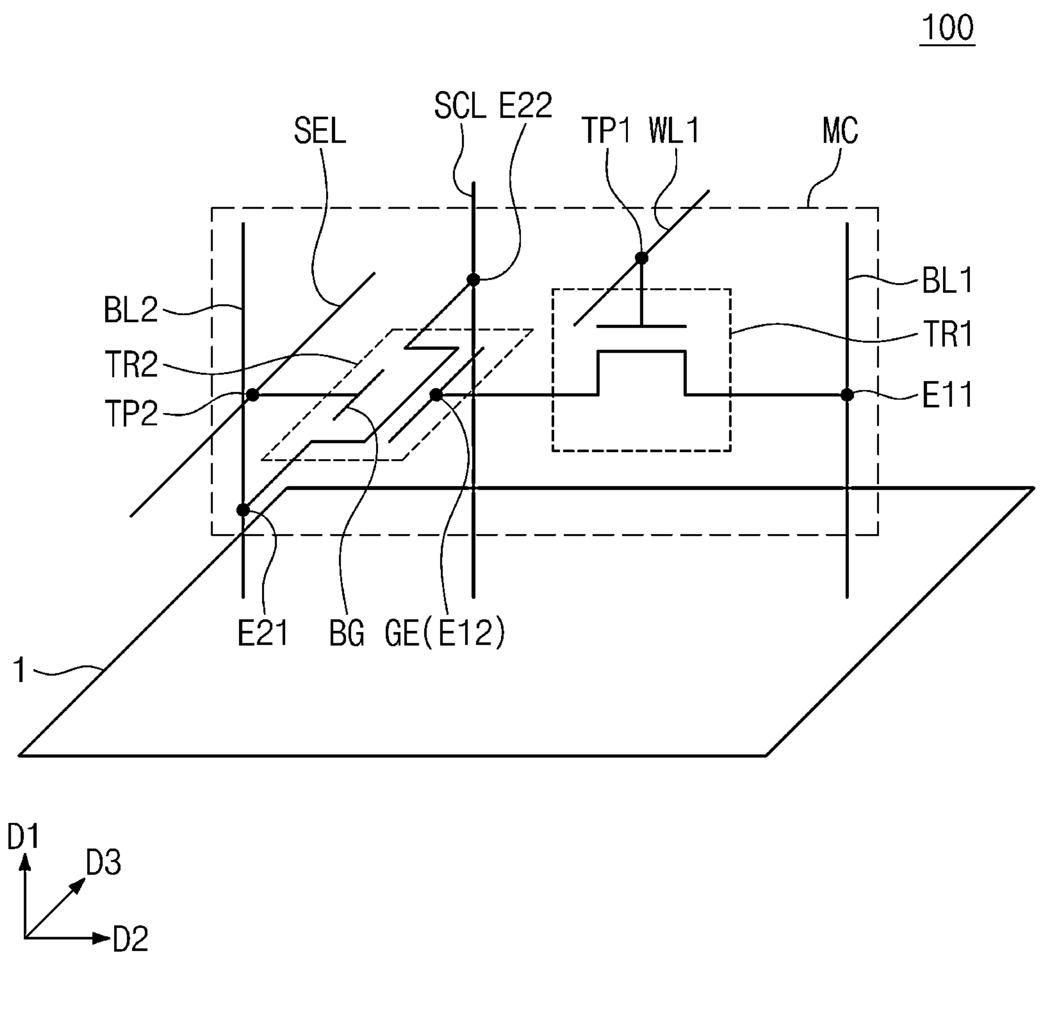
FIG. 1 is a circuit diagram of a three-dimensional semiconductor memory device according to some embodiments of the present invention.
Figure 2:
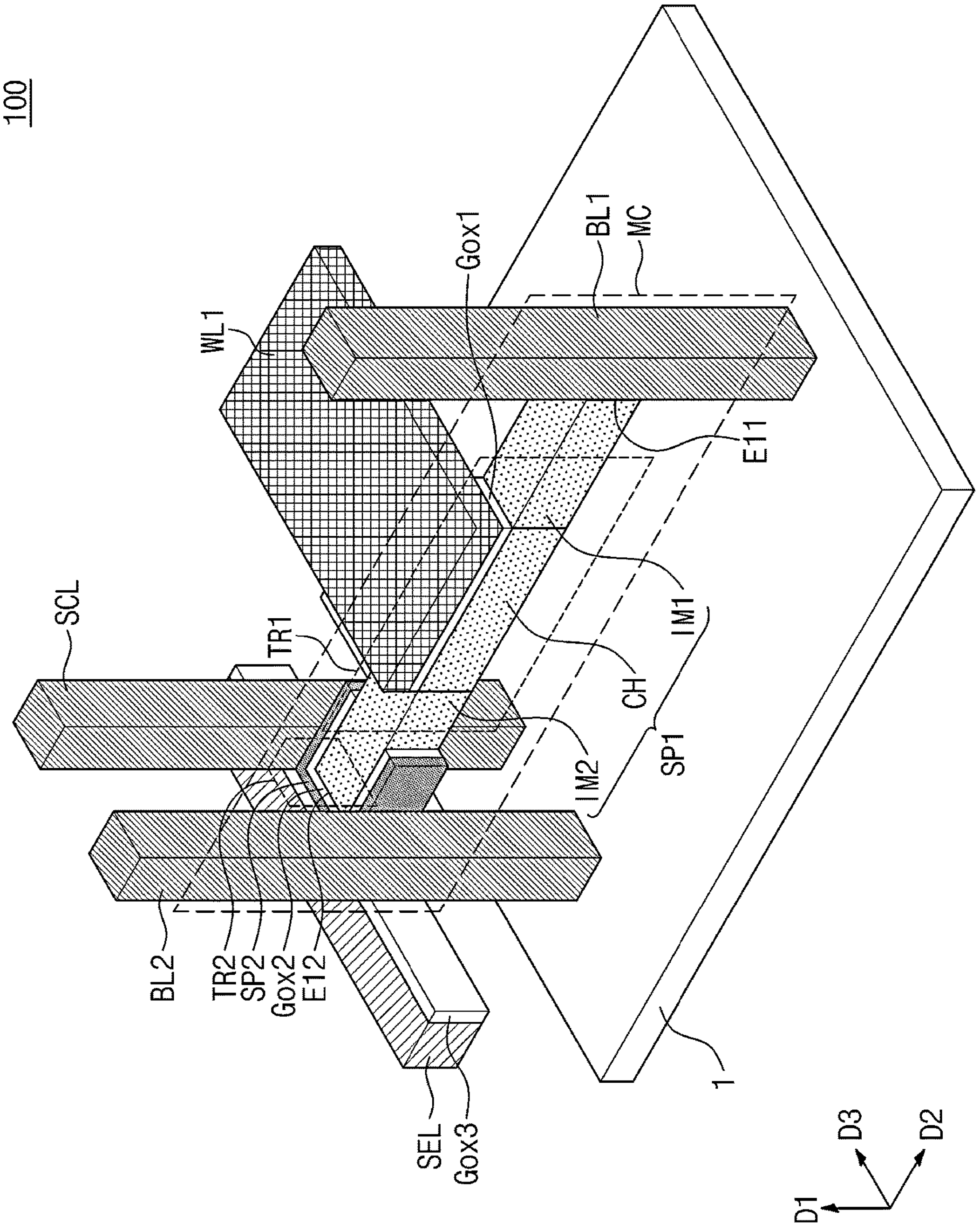
FIG. 2 is a perspective view of a three-dimensional semiconductor memory device having the circuit diagram of FIG. 1.
Figure 3:
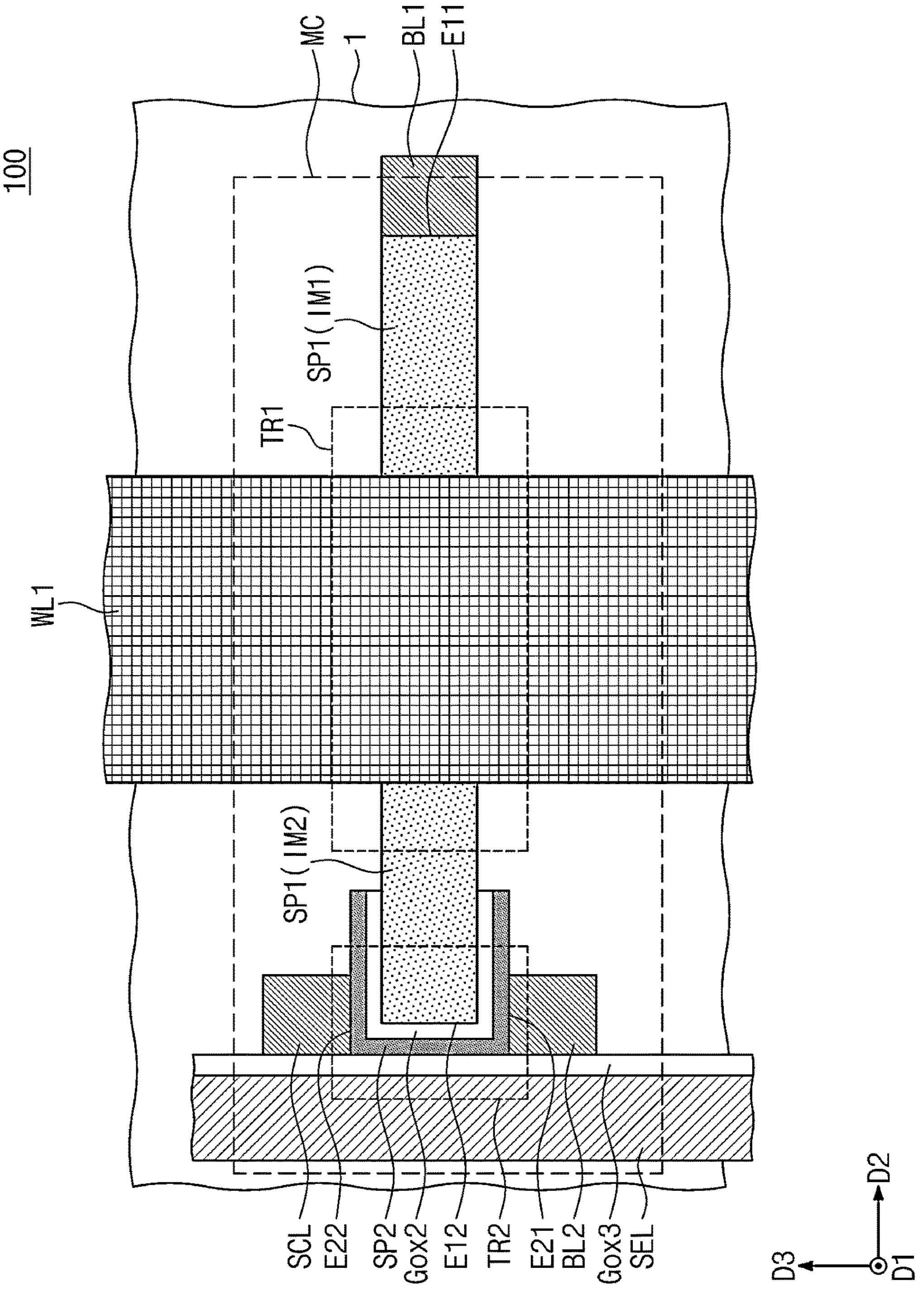
FIG. 3 is a plan view of a three-dimensional semiconductor memory device having the perspective view of FIG. 2.

FIG. 1 is a circuit diagram of a three-dimensional semiconductor memory device according to some embodiments of the present invention. FIG. 2 is a perspective view of a three-dimensional semiconductor memory device having the circuit diagram of FIG. 1. FIG. 3 is a plan view of a three-dimensional semiconductor memory device having the perspective view of FIG. 2.

Referring to FIGS. 1 to 3, a three-dimensional semiconductor memory device 100 according to the present embodiment includes memory cells MC disposed on a substrate 1. The substrate 1 may be, for example, a silicon single crystal wafer or a silicon on insulator (SOI) substrate. Although not shown, a plurality of transistors and wirings may be disposed on the substrate 1. The substrate 1 may be covered with an insulating layer. As used herein, an element or region that is "covered" by another element or region may be completely or partially covered by the other element or region.

One memory cell MC may include a first transistor TR1 and a second transistor TR2 connected thereto. The first transistor TR1 may be referred to as a write transistor. The first transistor TR1 may include a first terminal E11 and a second terminal E12 opposite to each other. The first terminal E11 of the first transistor TR1 is connected to a first bit line BL1. The first bit line BL1 extends in a first direction D1 perpendicular to an upper surface of the substrate 1. The second terminal E12 of the first transistor TR1 may be connected to a gate GE of the second transistor TR2. Alternatively, the second terminal E12 of the first transistor TR1 may function as a gate GE of the second transistor TR2. The first bit line BL1 may include a conductive material such as polysilicon doped with impurities, tungsten, aluminum, copper, titanium, iridium, or ruthenium. As used herein, "an element A extends in a direction X" (or similar language) may mean that the element A extends longitudinally in the direction X.

A sidewall of the first bit line BL1 is in contact with a first semiconductor pattern SP1. The first semiconductor pattern SP1 may be formed of silicon, germanium, an oxide semiconductor material, or a two-dimensional semiconductor material. The oxide semiconductor material may include at least one of indium (In), gallium (Ga), zinc (Zn), and tin (Sn). The oxide semiconductor material may be indium-gallium-zinc-oxide (IGZO) containing indium (In), gallium (Ga), and zinc (Zn). The two-dimensional semiconductor material may include a transition metal and a chalcogen element. The transition metal may be, for example, tungsten (W) or molybdenum (Mo). The chalcogen element may be, for example, sulfur (S), selenium (Se) or tellurium (Te). The two-dimensional semiconductor material may be $MoS_2$, $WS_2$, $MoSe_2$, or $WSe_2$.

The first semiconductor pattern SP1 may have a bar shape elongated in a second direction D2 parallel to the upper surface of the substrate 1. The first semiconductor pattern SP1 may include a channel region CH and a first source/drain region IM1 and a second source/drain region IM2 respectively disposed on both sides of the channel region CH. The channel region CH may have a first conductivity type. The first source/drain region IM1 and the second source/drain region IM2 may have a second conductivity type opposite to the first conductivity type. The first source/drain region IM1 and the second source/drain region IM2 may be doped with impurities having the second conductivity type.

The first semiconductor pattern SP1 includes a first end E11 and a second end E12 opposite to each other. The first end E11 of the first semiconductor pattern SP1 may in contact with the sidewall of the first bit line BL1 and may correspond to the first terminal E11 of the first transistor TR1. The second end E12 of the first semiconductor pattern SP1 may correspond to the second terminal E12 of the first transistor TR1. The second end E12 or the second source/drain region IM2 of the first semiconductor pattern SP1 may serve as a gate GE of the second transistor TR2. Charges may be stored in the second end E12 or the second source/drain region IM2 of the first semiconductor pattern SP1 which serves as a storage node. When the first semiconductor pattern SP1 is formed of an oxide semiconductor material, leakage current is relatively small, and charge is easily stored.

A first word line WL1 is disposed on a middle portion (e.g., a center) of the first semiconductor pattern SP1. The first word line WL1 may extend in a third direction D3 crossing the first and second directions D1 and D2. The third direction D3 may be parallel to the upper surface of the substrate 1. A first gate insulating layer Gox1 may be interposed between the first word line WL1 and the first semiconductor pattern SP1. A portion of the first word line WL1 may correspond to a gate of the first transistor TR1.

A selection line SEL is adjacent to the second end E12 of the first semiconductor pattern SP1. The selection line SEL may extend in the third direction D3. A second semiconductor pattern SP2 is interposed between the selection line SEL and the second end E12 of the first semiconductor pattern SP1. A second gate insulating layer Gox2 is interposed between the second semiconductor pattern SP2 and the second end E12 of the first semiconductor pattern SP1. A third gate insulating layer Gox3 is interposed between the second semiconductor pattern SP2 and the selection line SEL. A portion of the selection line SEL may serve as a back gate BG of the second transistor TR2.

The second semiconductor pattern SP2 has a first end E21 and a second end E22 opposite to each other. The first end E21 of the second semiconductor pattern SP2 is in contact with a second bit line BL2. The second end E22 of the second semiconductor pattern SP2 is in contact with a source line SCL. The second bit line BL2 and the source line SCL may extend in the first direction D1. The third gate insulating layer Gox3 may extend along a side of the selection line SEL and may be interposed between the selection line SEL and the second bit line BL2 and between the selection line SEL and the source line SCL.

The second semiconductor pattern SP2 may be formed of silicon, germanium, an oxide semiconductor material, or a two-dimensional semiconductor material. Preferably, the second semiconductor pattern SP2 may be formed of silicon, germanium, or silicon germanium having relatively high charge mobility.

The second semiconductor pattern SP2 and the second gate insulating layer Gox2 may be interposed between a side surface of the first semiconductor pattern SP1 and the second bit line BL2 and between the side surface of the first semiconductor pattern SP1 and the source line SCL.

The first to third gate insulating layers Gox1, Gox2, and Gox3 may each independently have a single layer or multilayer structure of at least one of silicon oxide, silicon nitride, silicon oxynitride, and metal oxide. The selection line SEL, the second bit line BL2, and the source line SCL may each independently include a conductive material such as polysilicon doped with impurities, tungsten, aluminum, copper, titanium, iridium, or ruthenium. A lower surface of the first word line WL1 may have a higher level than an upper surface of the selection line SEL.

Although one memory cell MC is shown in the three-dimensional semiconductor memory device 100 according to FIGS. 1 to 3, the memory cell MC may be alternately formed in first to third directions D1, D2, and D3 and/or may be repeatedly arranged to form a memory cell array.

The three-dimensional semiconductor memory device 100 according to the present embodiment may also be referred to as a two transistor-zero capacitor (2T-0C) DRAM. In the three-dimensional semiconductor memory device 100 according to the present embodiment, the second transistor TR2 may function as a capacitor. The three-dimensional semiconductor memory device 100 according to the present embodiment does not include a conventional capacitor. Therefore, the area occupied by the capacitor may be reduced, and the three-dimensional semiconductor memory device with high integration may be provided.

In the memory cell MC in the three-dimensional semiconductor memory device 100 according to the present embodiment, the first transistor TR1 may be turned on to program the memory cell MC and an electrical signal (charge) received from the first bit line BL1 may be transferred to the second terminal E12 of the first transistor TR1, and thus, a threshold voltage of the second transistor TR2 may be various. When an electrical signal is applied to the second bit line BL2 to read the memory cell MC, the electrical signal may be read through the source line SCL. During the read operation of the memory cell MC, the selection line SEL may serve as a back gate to adjust the threshold voltage of the second transistor TR2 and prevent unselected memory cells from being read.

Referring to FIG. 1, the memory cell MC according to the present invention includes the first terminal E11 connected to the first bit line BL1, the second terminal TP1 connected to the first word line WL1, the third terminal E21 connected to the second bit line BL2, the fourth terminal E22 connected to the source line SCL, and a fifth terminal TP2 connected to the selection line SEL. Accordingly, the memory cell MC including five terminals and five wirings has a structure suitable for arranging/expanding in three dimensions. As a result, density of memory cells may be easily increased, and thus, the three-dimensional semiconductor memory device having a high-capacity memory may be implemented.

Figure 4:
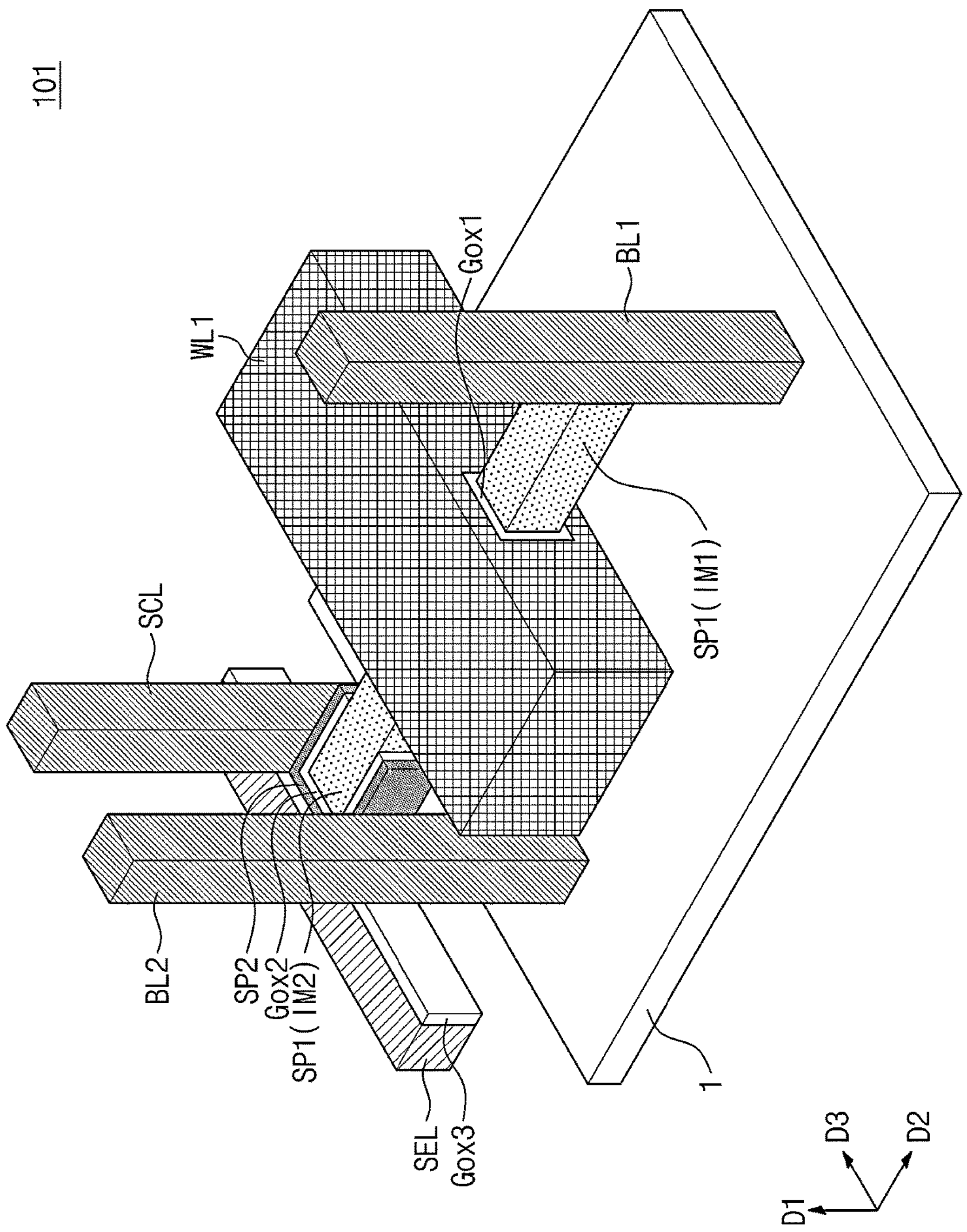
FIG. 4 is a perspective view of a three-dimensional semiconductor memory device according to some embodiments of the present invention.

FIG. 4 is a perspective view of a three-dimensional semiconductor memory device according to some embodiments of the present invention.

Referring to FIG. 4, in a three-dimensional semiconductor memory device 101 according to the present embodiment, a first word line WL1 may cover an upper, bottom, front and back surfaces of a first semiconductor pattern SP1. A first gate insulating layer Gox1 may be interposed between the first word line WL1 and the first semiconductor pattern SP1. In this example, a gate all around (GAA) structure is disclosed. Other structures may be the same/similar to those described with reference to FIGS. 1 to 3.

Figure 5:
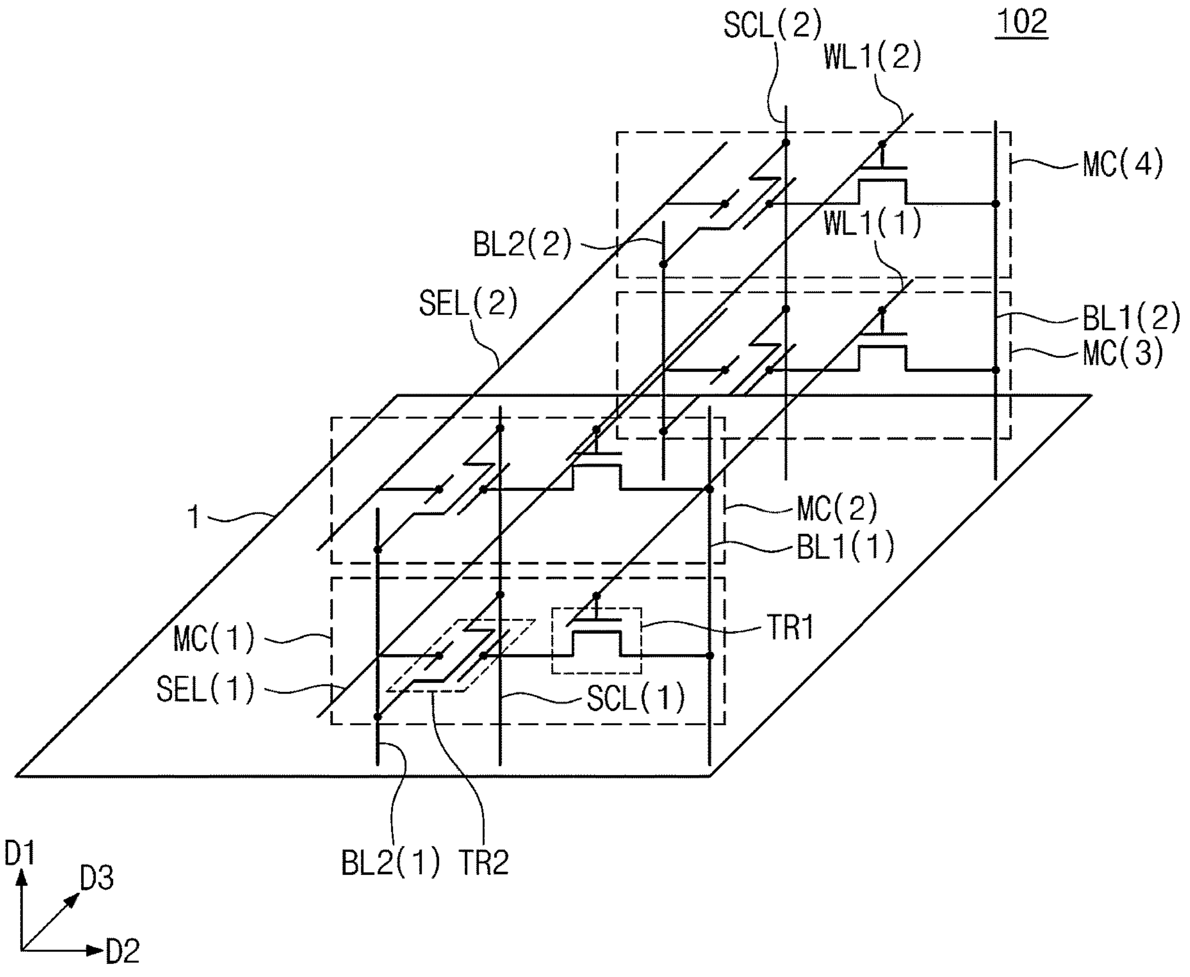
FIG. 5 is a circuit diagram of a three-dimensional semiconductor memory device according to some embodiments of the present invention.
Figure 6:
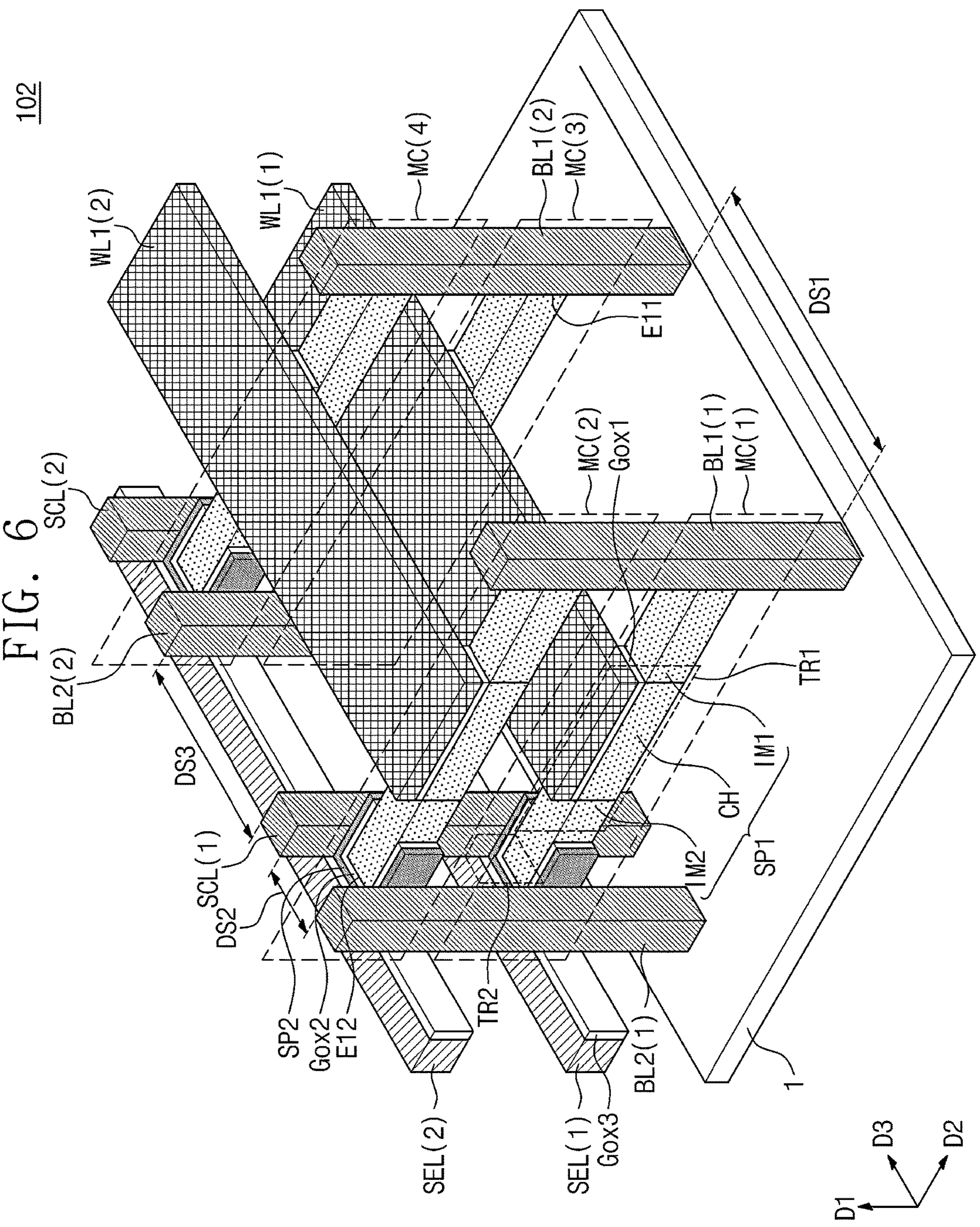
FIG. 6 is a perspective view of a three-dimensional semiconductor memory device having the circuit diagram of FIG. 5.

FIG. 5 is a circuit diagram of a three-dimensional semiconductor memory device according to some embodiments of the present invention. FIG. 6 is a perspective view of a three-dimensional semiconductor memory device having the circuit diagram of FIG. 5.

Referring to FIGS. 5 and 6, in a three-dimensional semiconductor memory device 102 according to the present embodiment, memory cells MC(1) to MC(4) are repeatedly disposed on a substrate 1 in a first direction D1 and a third direction D3 to form a memory cell array. The first and second memory cells MC(1) and MC(2) area connected to the same first bit line BL1(1), second bit line BL2(1), and source line SCL(1). The third and fourth memory cells MC(3) and MC(4) are connected to the same first bit line BL1(2) (also referred to as a fourth bit line), second bit line BL2(2) (also referred to as a third bit line), and source line SCL(2). The first and third memory cells MC(1) and MC(3) are connected to the same first word line WL1(1) and selection line SEL(1). The second and fourth memory cells MC(2) and MC(4) are connected to the same first word line WL1(2) and selection line SEL(2).

In detail, a first word line WL1(1) disposed at a lower level may extend in the third direction D3 and may be adjacent to upper surfaces of first semiconductor patterns SP1 belonging to the first memory cell MC(1) and the third memory cell MC(3). Second ends E12 of the first semiconductor patterns SP1 belonging to the first memory cell MC(1) and the third memory cell MC(3) are adjacent to the selection line SEL(1) disposed at a lower level.

A first word line WL1(2) disposed at higher level may extend in the third direction D3 and may be adjacent to upper surfaces of first semiconductor patterns SP1 belonging to the second memory cell MC(2) and the fourth memory cell MC(4). Second ends E12 of the first semiconductor patterns SP1 belonging to the second memory cell MC(2) and the fourth memory cell MC(4) are adjacent to the selection line SEL(2) disposed at a higher level.

The first bit lines BL1(1) and BL1(2) adjacent in the third direction D3 may be spaced apart from each other by a first distance DS1. The second bit line BL2(1) and the source line SCL(1) in contact to both ends of the second semiconductor pattern SP2 belonging to the first memory cell MC(1) are spaced apart from each other by a second distance DS2. The source line SCL(1) in contact to an end of the second semiconductor pattern SP2 belonging to the first memory cell MC(1) may be spaced apart from the second bit line BL2(2) in contact with an end of the second semiconductor pattern SP2 belonging to the third memory cell MC(3) by a third distance DS3. The first distance DS1 may be greater than the second distance DS2 or the third distance DS3.

Figure 7A:
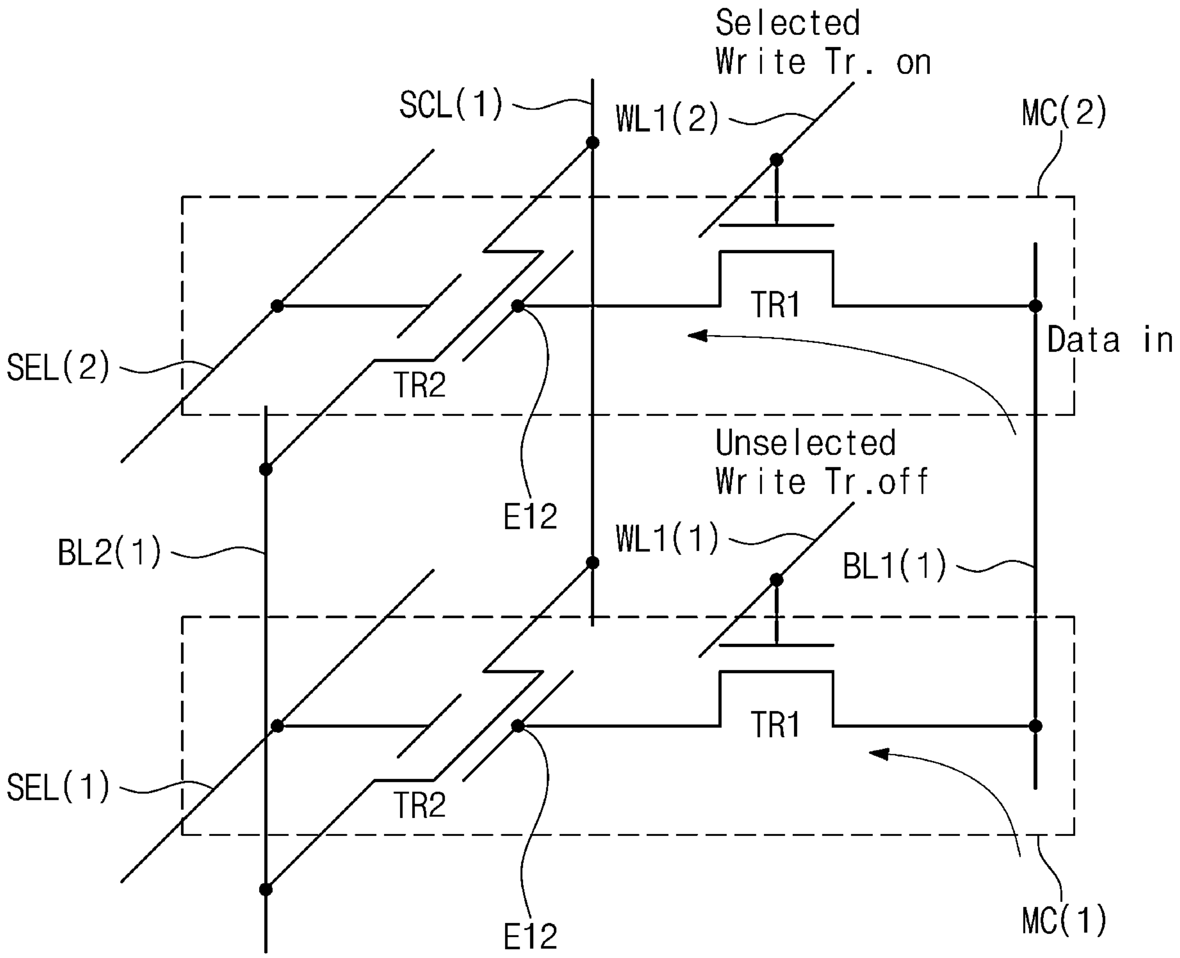
FIGS. 7A, 7B and 7C are diagrams illustrating operations of the three-dimensional semiconductor memory device of FIGS. 5 and 6.
Figure 7B:
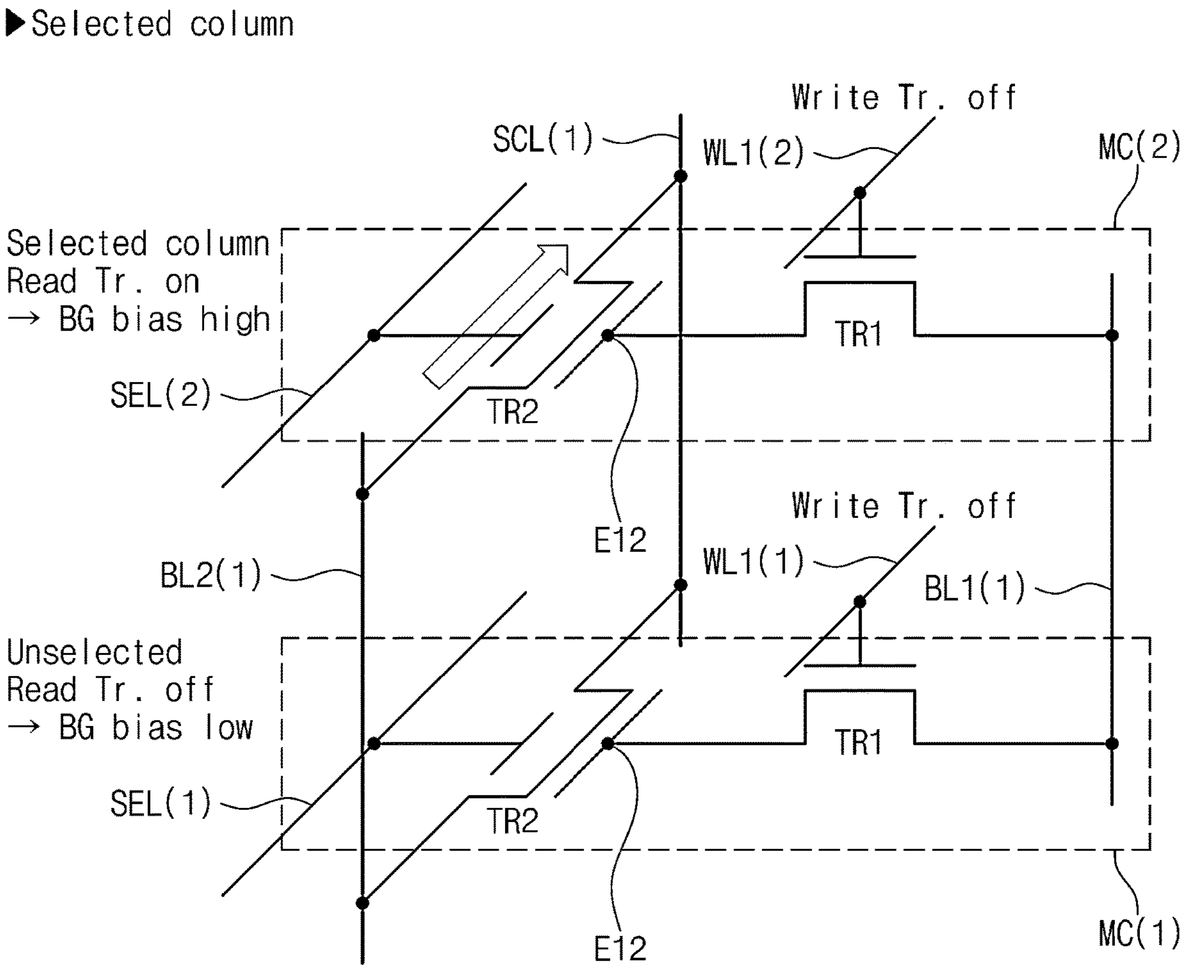
Figure 7C:
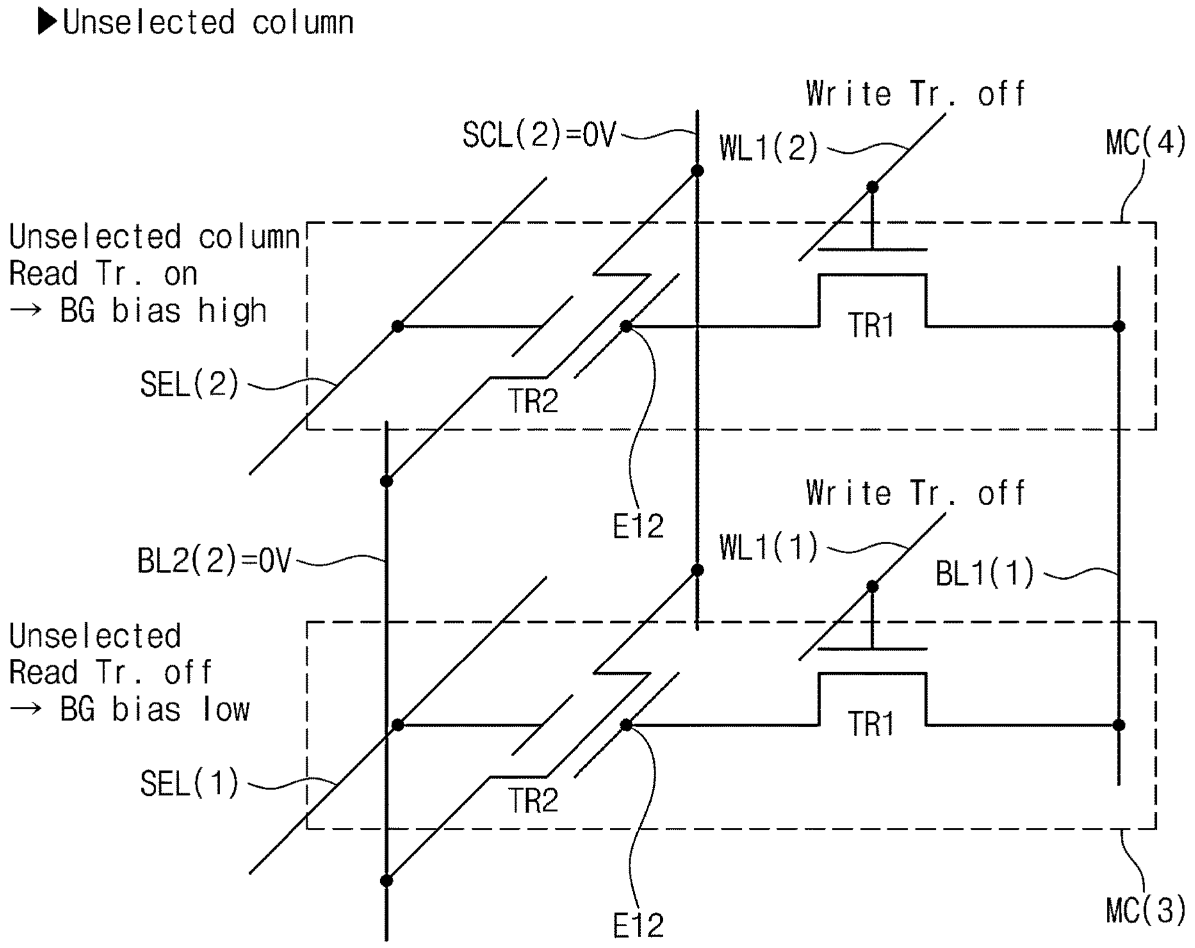

FIGS. 7A to 7C are diagrams illustrating operations of the three-dimensional semiconductor memory device of FIGS. 5 and 6.

Referring to FIG. 7A, for example, to program a second memory cell MC(2) among memory cells MC(1) to MC(4), when a turn on voltage is applied to the first word line WL1(2) connected to the second memory cell MC(2), the first transistor TR1 of the second memory cell MC(2) is turned on. When a program voltage is applied to the first bit line BL1(1) connected to the second memory cell MC(2), an electrical signal (charge or data) may be supplied to the second terminal E12 of the first transistor TR1 of the second memory cell MC(2) and stored in the second terminal E12 of the first transistor TR1. Accordingly, the second transistor TR2 of the second memory cell MC(2) may be turned on or a threshold voltage may be changed (or lowered). When no voltage is applied to the first bit line BL1(2) and the first word line WL1(1) that are not connected to the second memory cell MC(2) or a turn off voltage is applied thereto, data is prevented from entering unselected memory cells MC(1), MC(3), and MC(4).

Referring to FIGS. 7B and 7C, for example, to read the second memory cell MC(2) among the memory cells MC(1) to MC(4), a ground voltage or 0V may be applied to the source lines SCL(1) and SCL(2). A read voltage is applied to the second bit line BL2(1) connected to the second memory cell MC(2). When the second transistor TR2 of the second memory cell MC(2) is turned on by a program operation, an electric signal (or a read voltage, for example, 1V) applied to the second bit line BL2(1) may be read by the source line SCL(1). When the second transistor TR2 of the second memory cell MC(2) is not turned on, a selection voltage may be applied to the selection line SEL(2) connected to the second memory cell MC(2), the second transistor TR2 of the second memory cell MC(2) may be turned on, and an electrical signal applied to the second bit line BL2(1) may be read by the source line SCL(1).

When a read operation is performed on the second memory cell MC(2), no voltage is applied to the second bit line BL2(2) and the selection line SEL(1) that are not connected to the second memory cell MC(2) or a non-selection voltage (e.g., 0V) is applied, and thus the second transistors TR2 of the unselected memory cells MC(1), MC(3), and MC(4) are turned off and the unselected memory cells MC(1), MC(3), and MC(4) are prevented from being read.

In the present disclosure, an access layer may be selected in a three-dimensional semiconductor memory device using the selection lines SEL(1) and SEL(2). In the present disclosure, a current amount of the read transistor TR2 of the selected memory cell may be determined depending on a bias (or voltage) of the back gate BG by the selection lines SEL(1) and SEL(2) and a data state of the storage node E12.

When there are no selection lines SEL(1) and SEL(2) and both the second memory cell MC(2), the first memory cell MC(1) are programmed, and a read operation on the second memory cell MC(2) is performed, the second transistor TR2 of the first memory cell MC(1) may be also turned on and an electric signal applied to the second bit line BL2(1) may also be transferred through the first memory cell MC(1). Then, it is difficult to determine whether the detected electrical signal is from the second memory cell MC(2) or the first memory cell MC(1). However, in the present disclosure, when the second memory cell MC(2) and the first memory cell MC(1) are connected to different selection lines SEL(1) and SEL(2), and different voltages are applied to the selection lines SEL(1) and SEL(2), only a desired memory cell (e.g., the second memory cell MC(2)) may be selected. Accordingly, an accurate read operation may be performed to provide the three-dimensional semiconductor memory device with improved reliability.

To perform an erase operation on the second memory cell MC(2), when the first transistor TR1 of the second memory cell MC(2) is turned on, 0V may be applied to the first bit line BL1(1) connected to the second memory cell MC(2).

Figure 8:
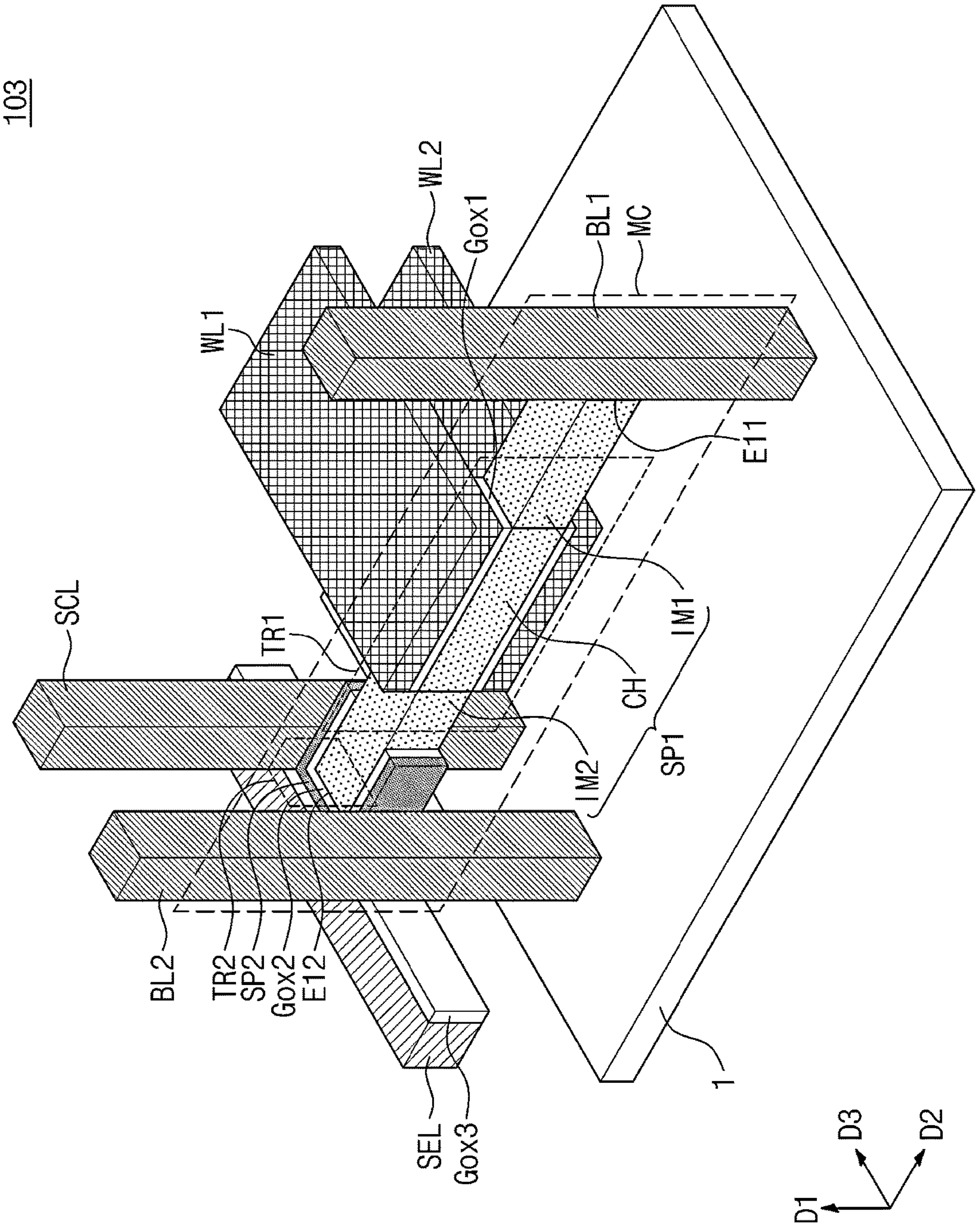
FIG. 8 is a perspective view of a three-dimensional semiconductor memory device according to some embodiments of the present invention.

FIG. 8 is a perspective view of a three-dimensional semiconductor memory device according to some embodiments of the present invention.

Referring to FIG. 8, the memory cell MC of the three-dimensional semiconductor memory device 103 according to the present embodiment further includes a second word line WL2 adjacent to a lower surface of the first semiconductor pattern SPL. The second word line WL2 is connected to the first word line WL1 and the same voltage may be applied thereto. Alternatively, the second word line WL2 may be separated from the first word line WL1 and different voltages may be applied thereto. The second word line WL2 may serve as a back gate BG of the first transistor TR1. A first gate insulating layer Gox1 may be interposed between the second word line WL2 and the first semiconductor pattern SP1. Other structures may be the same/similar to those described with reference to FIGS. 1 to 3.

Figure 9:
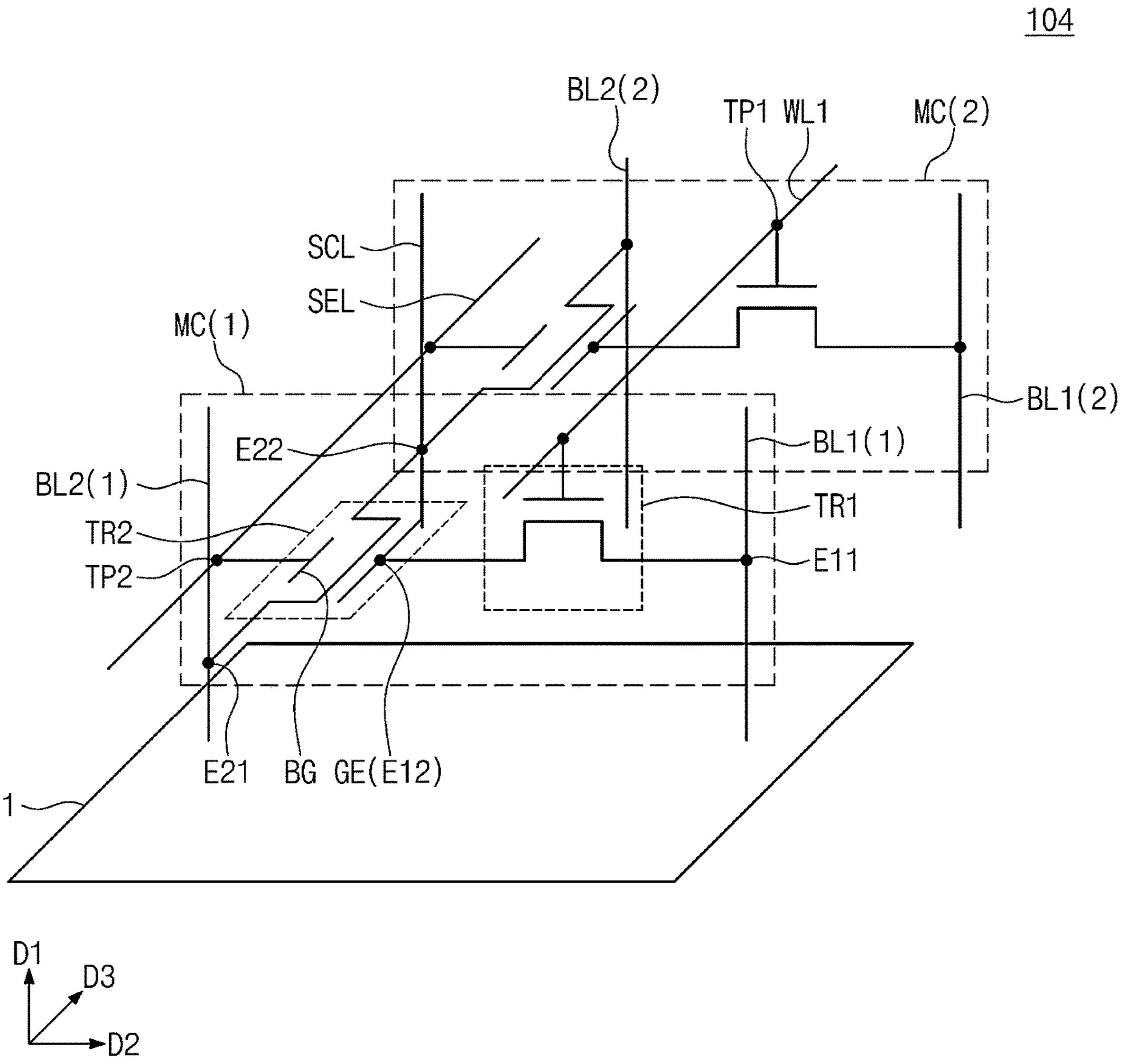
FIG. 9 is a circuit diagram of a three-dimensional semiconductor memory device according to some embodiments of the present invention.
Figure 10A:
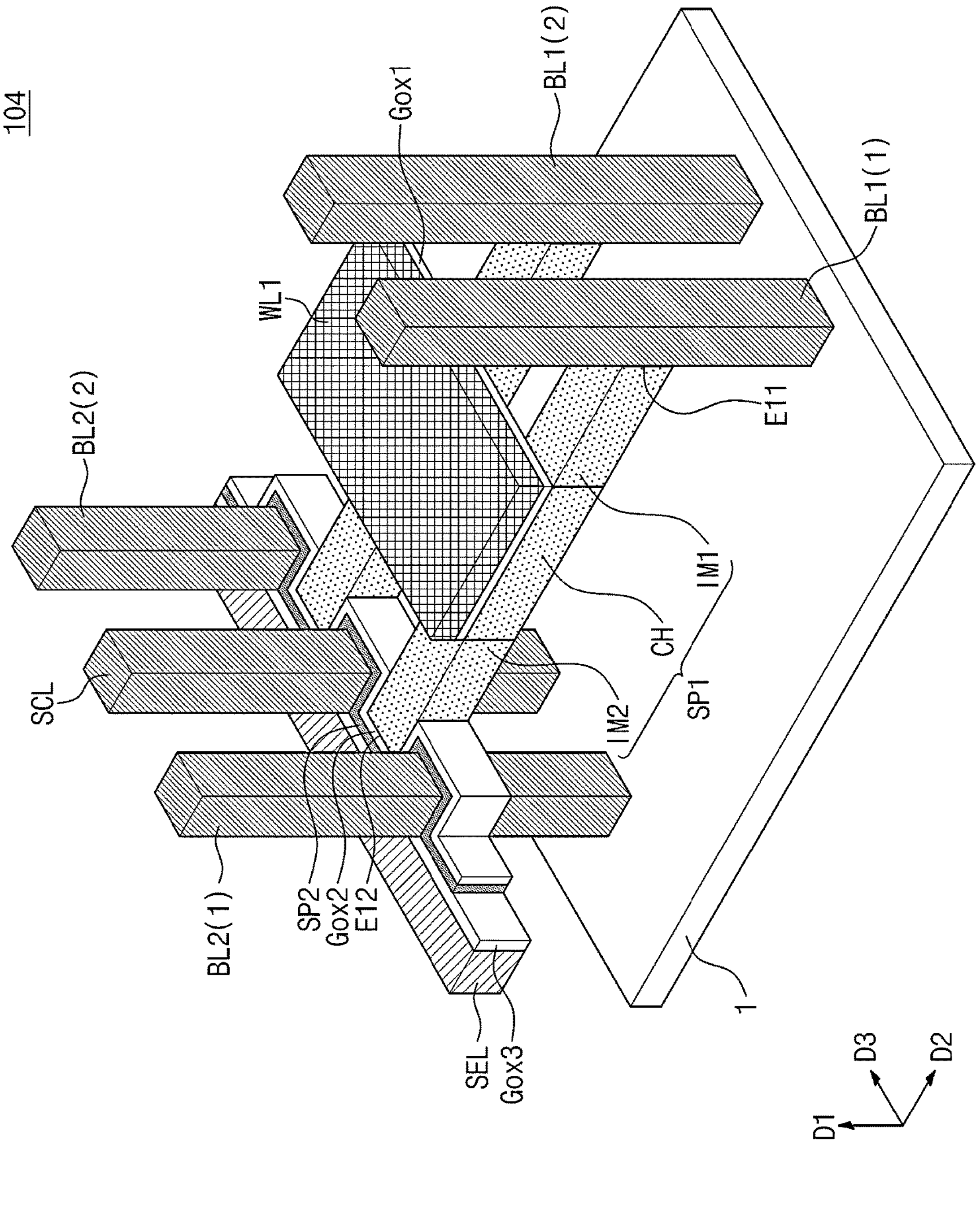
FIG. 10A is a perspective view of a three-dimensional semiconductor memory device having the circuit diagram of FIG. 9.
Figure 10B:
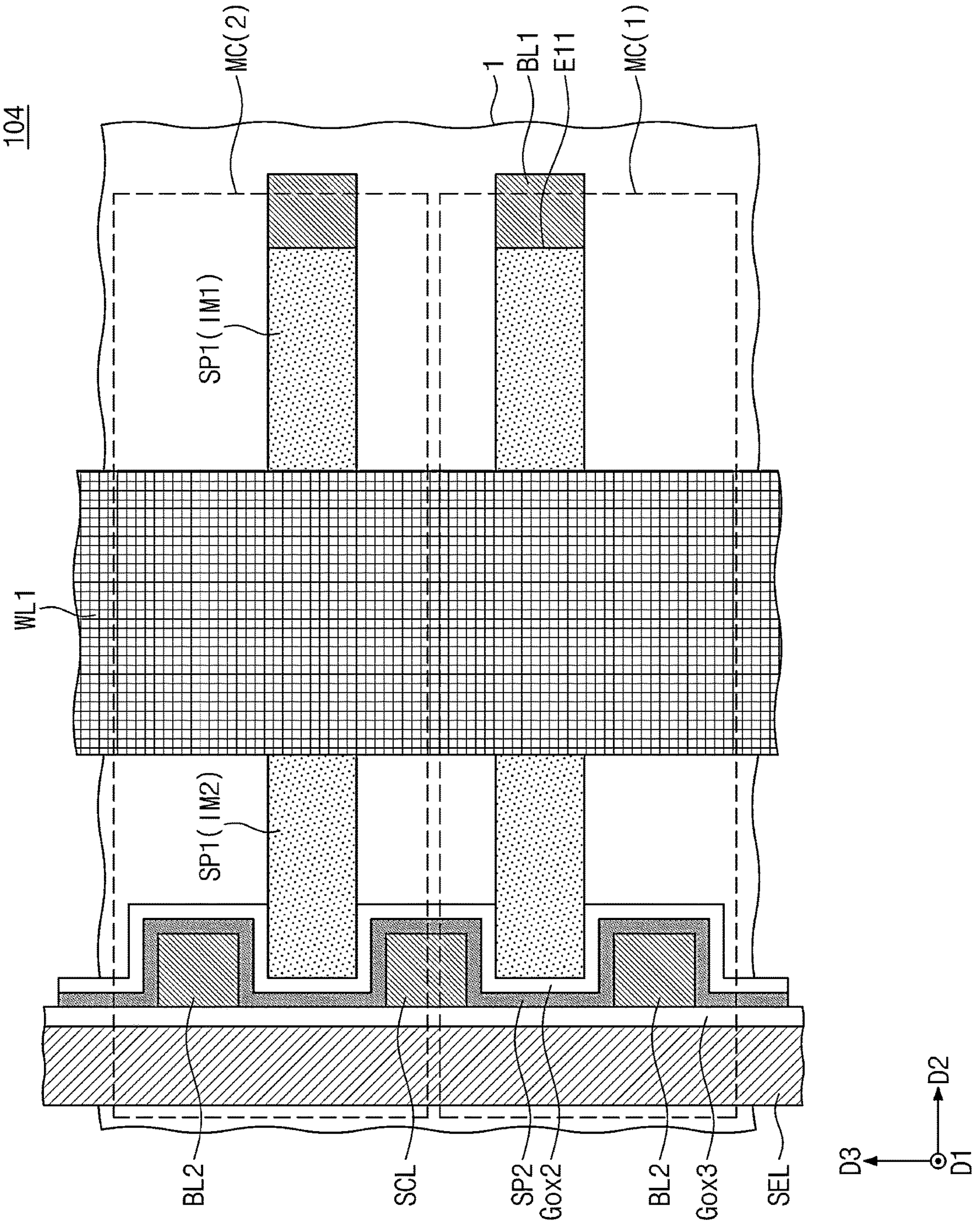
FIG. 10B is a plan view of a three-dimensional semiconductor memory device having the circuit diagram of FIG. 9.

FIG. 9 is a circuit diagram of a three-dimensional semiconductor memory device according to some embodiments of the present invention. FIG. 10A is a perspective view of a three-dimensional semiconductor memory device having the circuit diagram of FIG. 9. FIG. 10B is a plan view of a three-dimensional semiconductor memory device having the circuit diagram of FIG. 9.

Referring to FIGS. 9, 10A, and 10B, in a three-dimensional semiconductor memory device 104 according to the present embodiment, two memory cells MC(1) and MC(2) may be arranged in the third direction D3. The two memory cells MC(1) and MC(2) may have a mirror-symmetrical structure in the third direction D3. In some embodiments, the two memory cells MC(1) and MC(2) may be mirror-symmetric with respect to a plane (e.g., a plane defined by the first and second directions D1 and D2) that is perpendicular to the third direction D3, as illustrated in FIGS. 10A, and 10B. The two memory cells MC(1) and MC(2) may share a first word line WL1 and a selection line SEL. In addition, the two memory cells MC may share a source line SCL disposed therebetween. The first gate insulating layer Gox1 may extend in the third direction D3 and entirely cover a lower surface of the first word line WL1. The second semiconductor pattern SP2 and the second gate insulating layer Gox2 extend in the third direction D3 to cover side surfaces of the selection line SEL and the second bit lines BL2(1) and BL2(2). When viewed from a plan view, the second semiconductor pattern SP2 and the second gate insulating layer Gox2 may have a concavo-convex structure. Other structures may be the same/similar to those described above.

Figure 11:
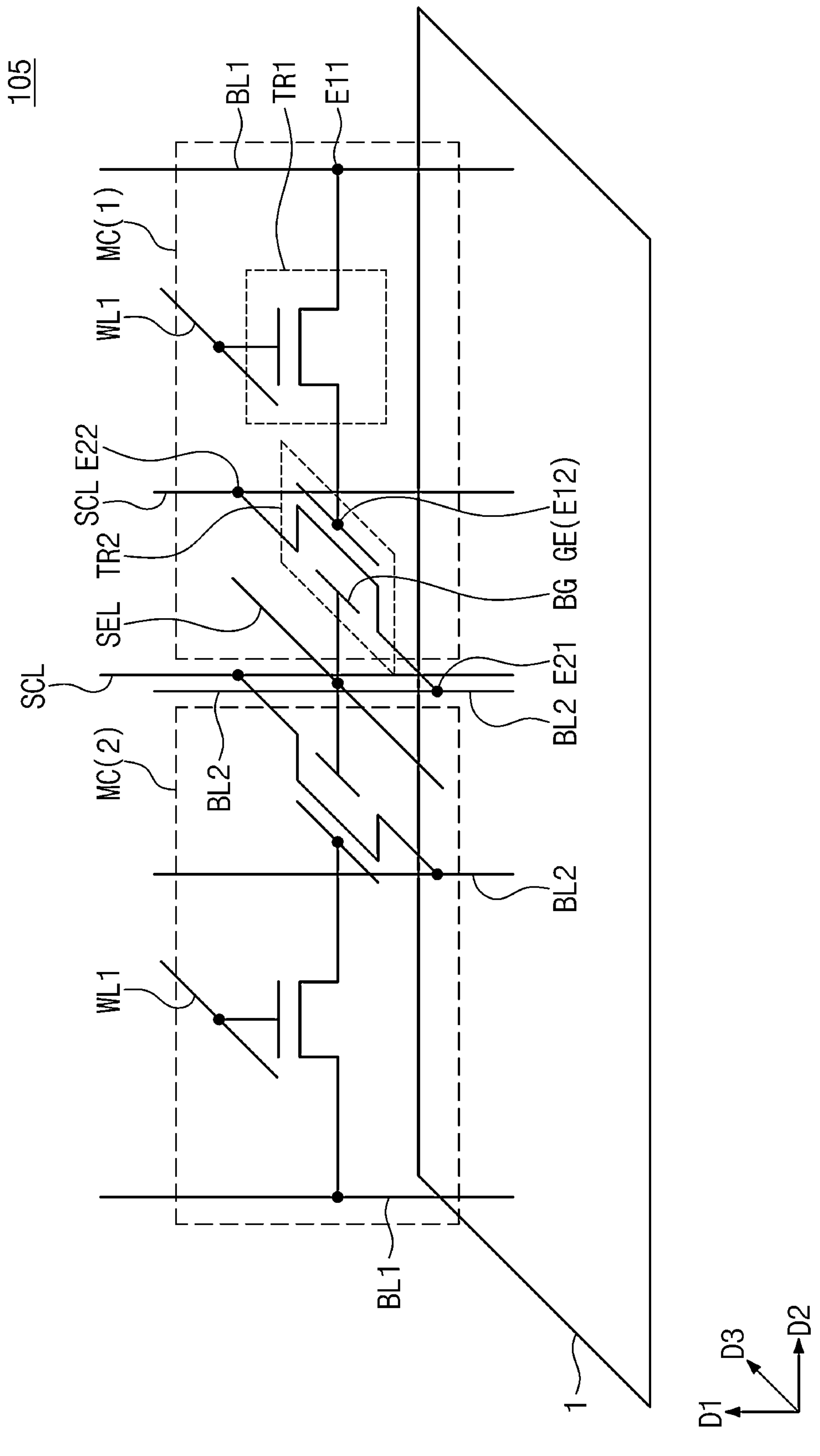
FIG. 11 is a circuit diagram of a three-dimensional semiconductor memory device according to some embodiments of the present invention.
Figure 12:
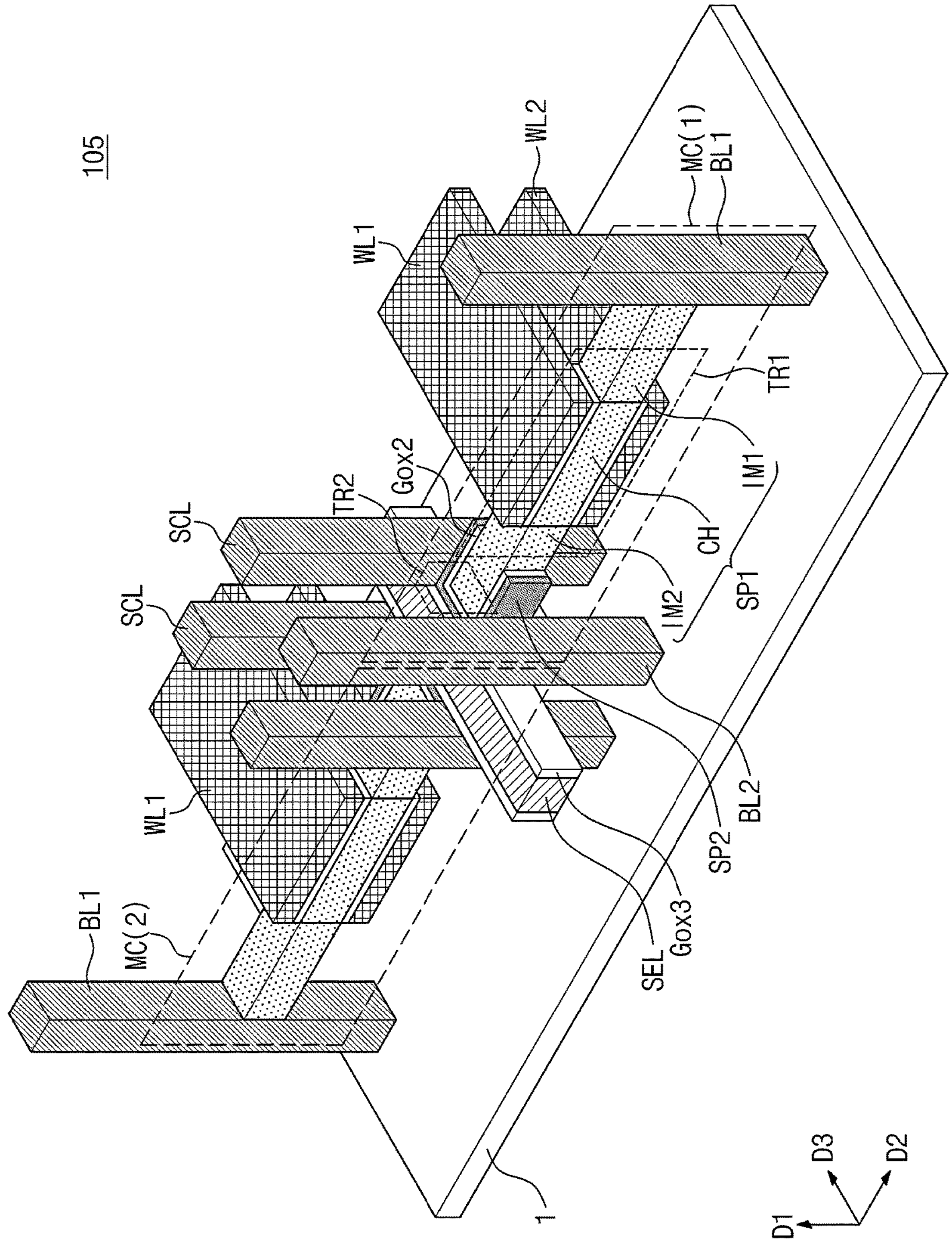
FIG. 12 is a perspective view of a three-dimensional semiconductor memory device having the circuit diagram of FIG. 11.

FIG. 11 is a circuit diagram of a three-dimensional semiconductor memory device according to some embodiments of present invention. FIG. 12 is a perspective view of a three-dimensional semiconductor memory device having the circuit diagram of FIG. 11.

Referring to FIGS. 11 and 12, in aa three-dimensional semiconductor memory device 105 according to the present embodiment, two memory cells MC(1) and MC(2) may be arranged in mirror symmetry with each other in the second direction D2. In some embodiments, the two memory cells MC(1) and MC(2) may be mirror-symmetric with respect to a plane (e.g., a plane defined by the first and third directions D1 and D3) that is perpendicular to the second direction D2, as illustrated in FIGS. 11 and 12. The two memory cells MC(1) and MC(2) may share a selection line SEL disposed therebetween. Both side surfaces of the selection line SEL may be covered with the third gate insulating layer Gox3. In FIG. 12, each of the memory cells MC(1) and MC(2) includes a second word line WL2, but the second word line WL2 is omitted from the circuit diagram of FIG. 11. Other structures may be the same/similar to those described above.

Figure 13:
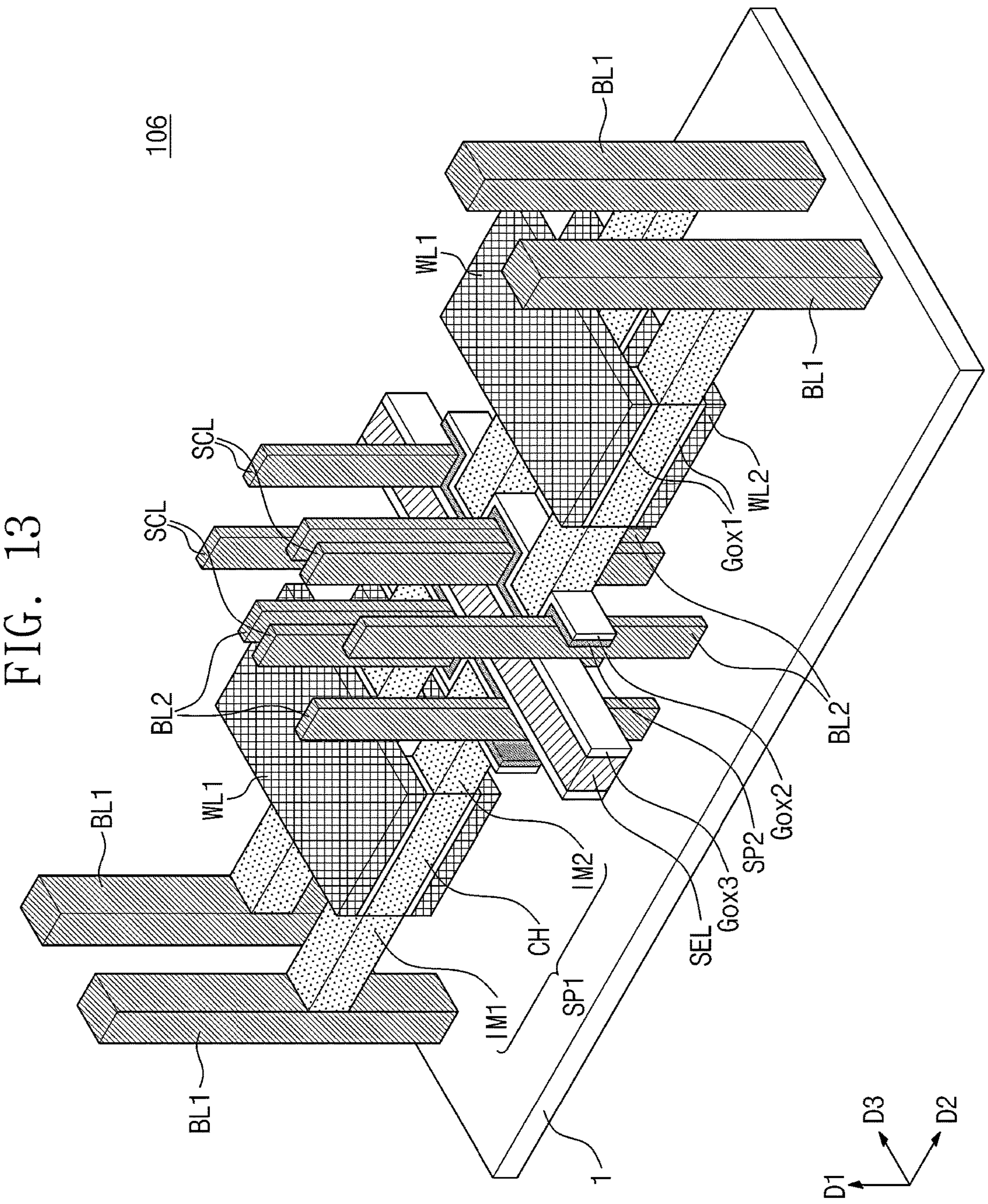
FIG. 13 is a perspective view of a three-dimensional semiconductor memory device according to some embodiments of the present invention.
Figure 14:
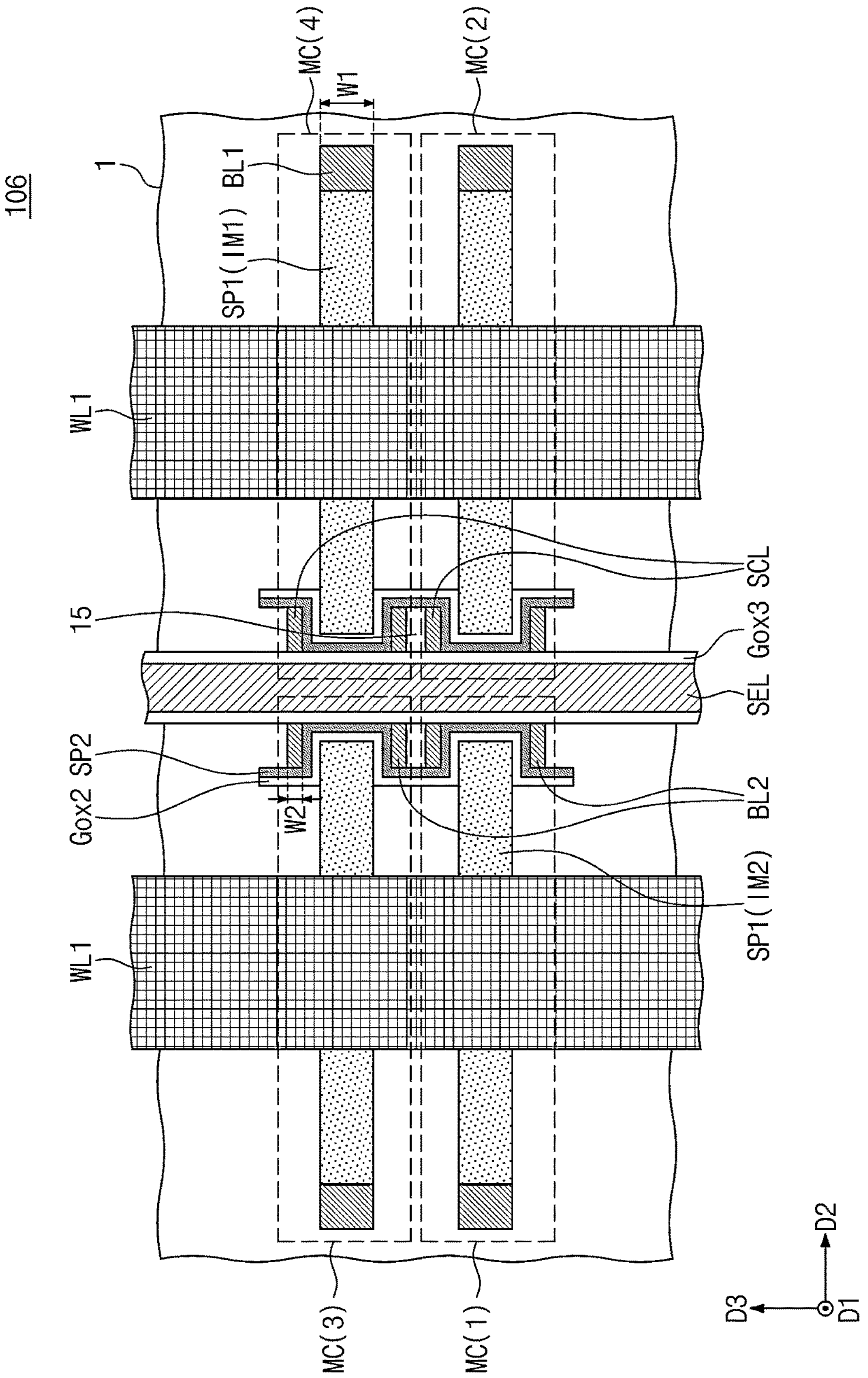
FIG. 14 is a plan view of a three-dimensional semiconductor memory device according to some embodiments of the present invention.

FIG. 13 is a perspective view of a three-dimensional semiconductor memory device according to some embodiments of the present invention. FIG. 14 is a plan view of a three-dimensional semiconductor memory device according to some embodiments of the present invention.

Referring to FIGS. 13 and 14, in a three-dimensional semiconductor memory device 106 according to the present embodiment, four memory cells MC(1) to MC(4) are tow-dimensionally arranged in the second direction D2 and the third direction D3. The first and third memory cells MC(1) and MC(3) have the same structure. The second and fourth memory cells MC(2) and MC(4) have the same structure. The first and third memory cells MC(1) and MC(3) may have a mirror-symmetrical structure to the second and fourth memory cells MC(2) and MC(4) in the second direction D2. In some embodiments, the first and third memory cells MC(1) and MC(3) may be mirror-symmetric with respect to a plane (e.g., a plane defined by the first and second directions D1 and D2) that is perpendicular to the third direction D3, as illustrated in FIGS. 13 and 14. The four memory cells MC(1) to MC(4) may share one selection line SEL with each other. The four memory cells MC(1) to MC(4) are connected to different first and second bit lines BL1 and BL2 and source lines SCL, respectively. The first bit line BL1 may have a first width W1 in the third direction D3. Each of the second bit line BL2 and the source line SCL may have a second width W2 in the third direction D3. The second width W2 may be smaller than the first width W1. An insulating pattern 15 may be interposed between the source line SCL connected to the first memory cell MC(1) and the second bit line BL2 connected to the third memory cell MC(3). The insulating pattern 15 may have a single layer structure or a multilayer structure of at least one of silicon oxide, silicon nitride, silicon oxynitride, and a porous insulator. The second semiconductor pattern SP2 and the second gate insulating layer Gox2 may extend to cover a side surface of the insulating pattern 15. The second bit lines BL2 and the source lines SCL may be alternately arranged in a row in the third direction D3. Other structures may be the same/similar to those described above.

Figure 15:
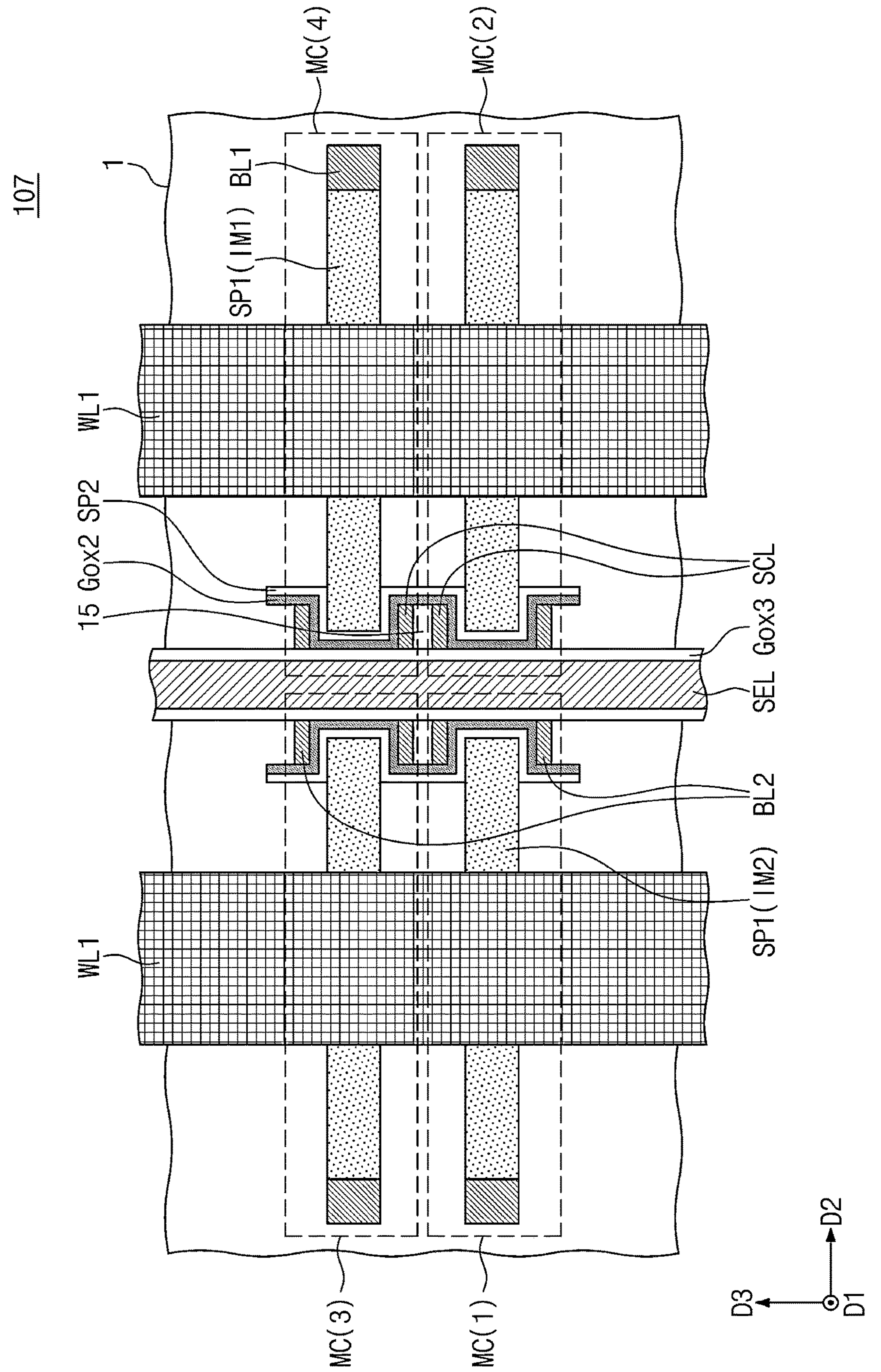
FIG. 15 is a plan view of a three-dimensional semiconductor memory device according to some embodiments of the present invention.

FIG. 15 is a plan view of a three-dimensional semiconductor memory device according to some embodiments of the present invention.

Referring to FIG. 15, in a three-dimensional semiconductor memory device 107 according to the present embodiment, four memory cells MC(1) to MC(4) are two-dimensionally disposed in the second direction D2 and the third direction D3. The first and third memory cells MC(1) and MC(3) have a mirror-symmetric structure with each other along the third direction D3. In some embodiments, the first and third memory cells MC(1) and MC(3) may be mirror-symmetric with respect to a plane (e.g., a plane defined by the first and second directions D1 and D2) that is perpendicular to the third direction D3, as illustrated in FIG. 15. The second and fourth memory cells MC(2) and MC(4) have a mirror-symmetric structure with each other along the third direction D3. In some embodiments, the second and fourth memory cells MC(2) and MC(4) may be mirror-symmetric with respect to a plane (e.g., a plane defined by the first and second directions D1 and D2) that is perpendicular to the third direction D3, as illustrated in FIG. 15. The first and third memory cells MC(1) and MC(3 and the second and fourth memory cells MC(2) and MC(4) may be mirror-symmetric with respect to a plane (e.g., a plane defined by the first and third directions D1 and D3) that is perpendicular to the second direction D2, as illustrated in FIG. 15. The four memory cells MC(1) to MC(4) may share one selection line SEL with each other. The four memory cells MC(1) to MC(4) are connected to different first and second bit lines BL1 and BL2 and source lines SCL, respectively. An insulating pattern 15 may be interposed between the source line SCL connected to the first memory cell MC(1) and the source line SCL connected to the third memory cell MC(3). Other structures may be the same/similar to those described above.

Figure 16:
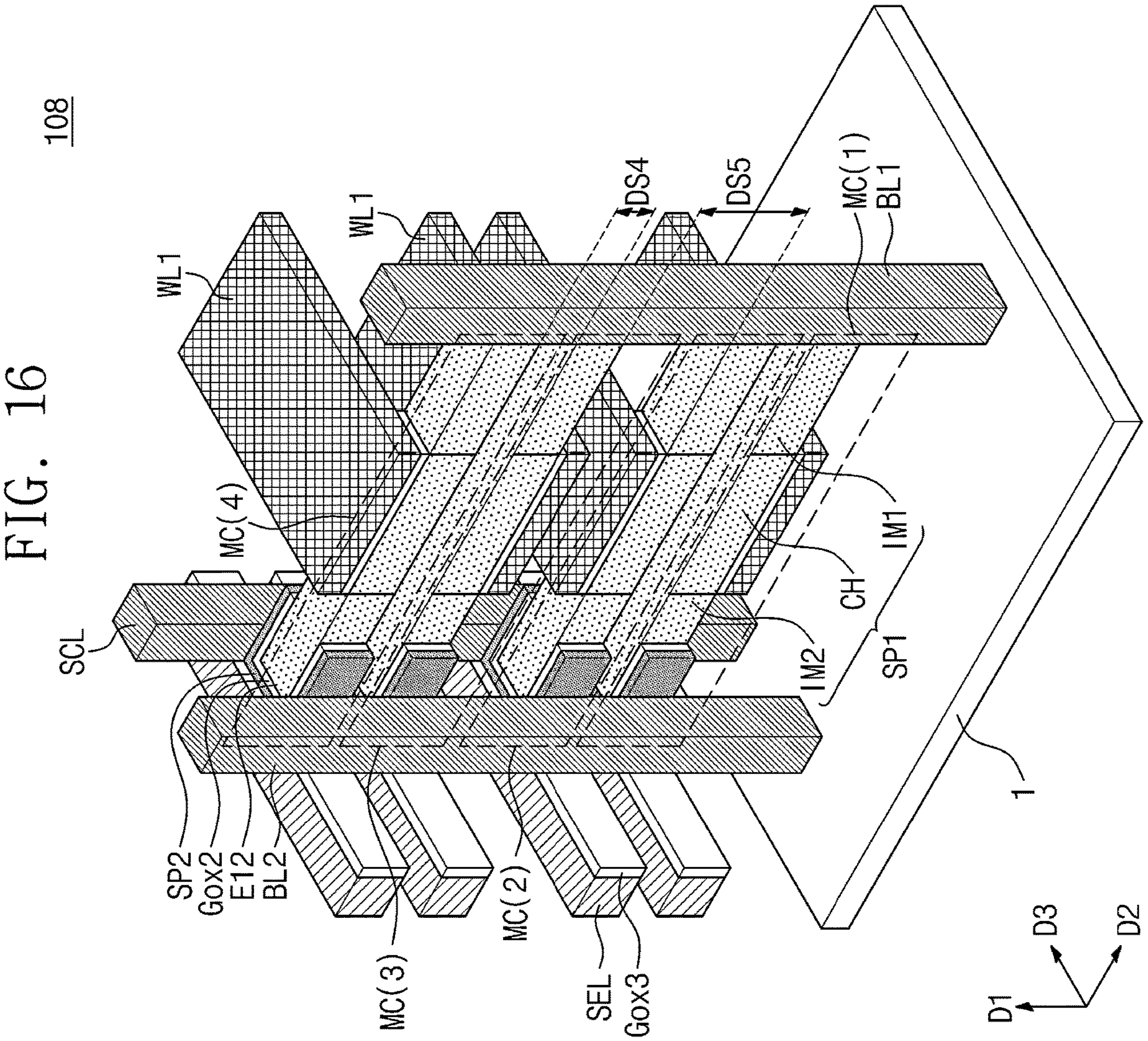
FIG. 16 is a perspective view of a three-dimensional semiconductor memory device according to some embodiments of the present invention.

FIG. 16 is a perspective view of a three-dimensional semiconductor memory device according to some embodiments of the present invention.

Referring to FIG. 16, in a three-dimensional semiconductor memory device 108 according to the present embodiment, four memory cells MC(1) to MC(4) are sequentially arranged in the first direction D1. The first and second memory cells MC(1) and MC(2) have a mirror-symmetrical structure in the first direction D1. In some embodiments, the first and second memory cells MC(1) and MC(2) may be mirror-symmetric with respect to a plane (e.g., a plane defined by the second and third directions D2 and D3) that is perpendicular to the first direction D1, as illustrated in FIG. 16. The third and fourth memory cells MC(3) and MC(4) have a mirror-symmetrical structure in the first direction D1. In some embodiments, the third and fourth memory cells MC(3) and MC(4) may be mirror-symmetric with respect to a plane (e.g., a plane defined by the second and third directions D2 and D3) that is perpendicular to the first direction D1, as illustrated in FIG. 16. In the first and third memory cells MC(1) and MC(3), the first word line WL1 is disposed under the first semiconductor pattern SP1. In the second and fourth memory cells MC(1) and MC(4), the first word line WL1 is disposed on the first semiconductor pattern SP1. The four memory cells MC(1) to MC(4) are connected to the same first bit line BL1, second bit line BL2, and source line SCL, respectively. The four memory cells MC(1) to MC(4) may be connected to different selection lines SEL, respectively. The first semiconductor patterns SP1 included in the first and second memory cells MC(1) and MC(2) may be spaced apart from each other by a fourth distance DS4 in the first direction D1. The first semiconductor patterns SP1 included in the third and fourth memory cells MC(3) and MC(4) may be spaced apart from each other by a fourth distance DS4 in the first direction D1. The first semiconductor patterns SP1 included in the second and third memory cells MC(2) and MC(3) may be spaced apart from each other by a fifth distance DS5 in the first direction D1. The fifth distance DS5 may be greater than the fourth distance DS4. Other structures may be the same/similar to those described above.

Figure 17A:
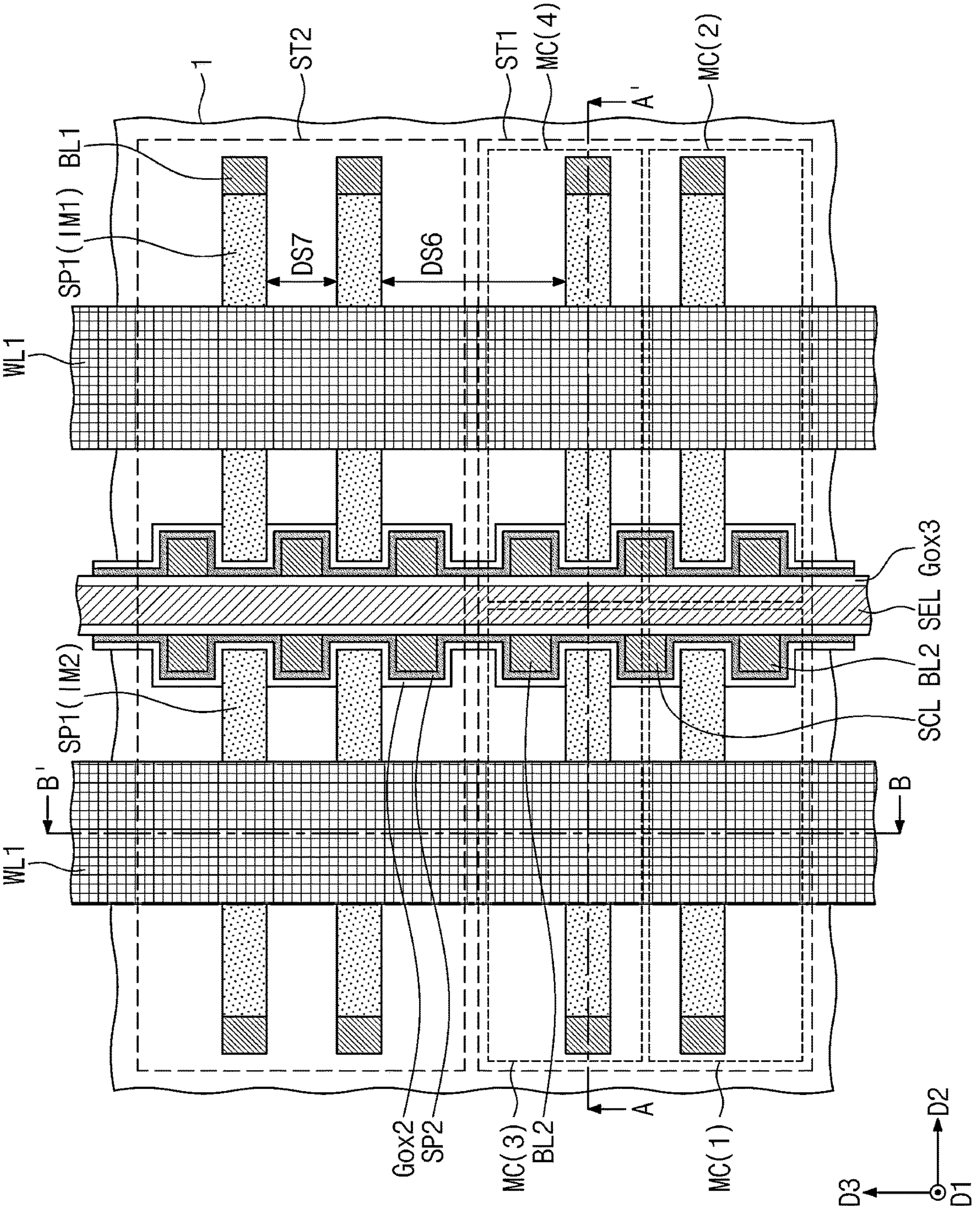
FIG. 17A is a plan view of a three-dimensional semiconductor memory device according to some embodiments of the present invention.
Figure 17B:
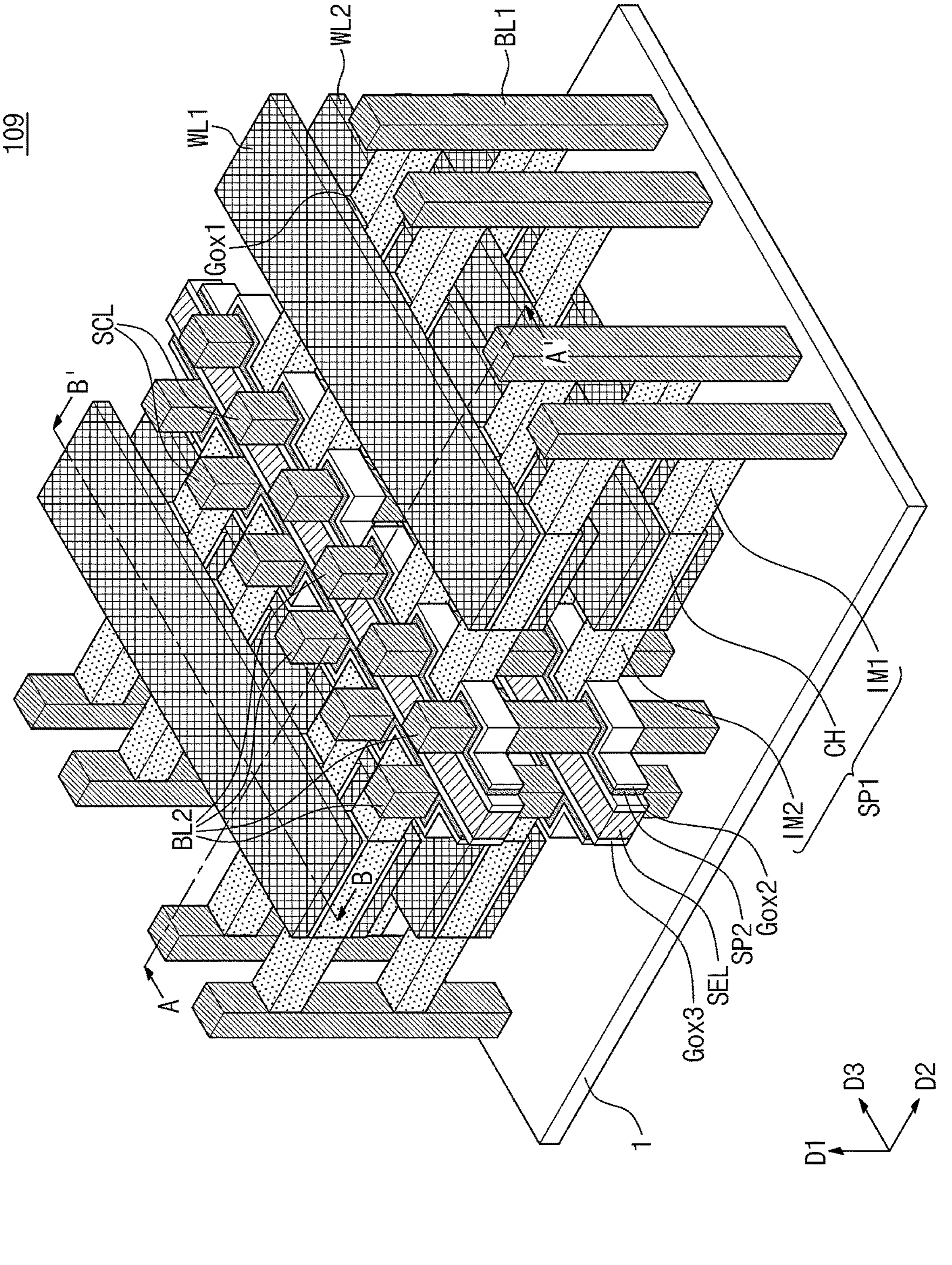
FIG. 17B is a perspective view of a three-dimensional semiconductor memory device according to some embodiments of the present invention.

FIG. 17A is a plan view of a three-dimensional semiconductor memory device according to some embodiments of the present invention. FIG. 17B is a perspective view of a three-dimensional semiconductor memory device according to some embodiments of the present invention.

Referring to FIGS. 17A and 17B, a three-dimensional semiconductor memory device 109 according to the present embodiment has a structure in which the structure of FIG. 10B is repeatedly disposed in first to third directions D1, D2, and D3. A first stack structure ST1 and a second stack structure ST2 may be spaced apart from each other in the third direction D3 and may have the same structure. The first stack structure ST1 and the second stack structure ST2 may include four memory cells MC(1) to MC(4) positioned at the same level. The four memory cells MC(1) to MC(4) may have a structure in which the structure of FIG. 10B and the structure of FIG. 12 are combined. The four memory cells MC(1) to MC(4) may share the same selection line SEL. The first and second memory cells MC(1) and MC(2) may have a mirror-symmetrical structure with each other in the second direction D2. In some embodiments, the first and second memory cells MC(1) and MC(2) may be mirror-symmetric with respect to a plane (e.g., a plane defined by the first and third directions D1 and D3) that is perpendicular to the second direction D2, as illustrated in FIGS. 17A, and 17B. The third and fourth memory cells MC(3) and MC(4) may have a mirror-symmetrical structure to each other in the second direction D2. In some embodiments, the third and fourth memory cells MC(3) and MC(4) may be mirror-symmetric with respect to a plane (e.g., a plane defined by the first and third directions D1 and D3) that is perpendicular to the second direction D2, as illustrated in FIGS. 17A, and 17B. The first and third memory cells MC(1) and MC(3) may have a mirror-symmetrical structure to each other in the third direction D3 and may share the source line SCL disposed therebetween. In some embodiments, the first and third memory cells MC(1) and MC(3) may be mirror-symmetric with respect to a plane (e.g., a plane defined by the first and second directions D1 and D2) that is perpendicular to the third direction D3, as illustrated in FIGS. 17A, and 17B. The second and fourth memory cells MC(2) and MC(4) may have a mirror-symmetrical structure to each other in the third direction D3 and may share the source line SCL disposed therebetween. In some embodiments, the second and fourth memory cells MC(2) and MC(4) may be mirror-symmetric with respect to a plane (e.g., a plane defined by the first and second directions D1 and D2) that is perpendicular to the third direction D3, as illustrated in FIGS. 17A, and 17B. The first semiconductor pattern SP1 included in the first stack structure ST1 and adjacent to the second stack structure ST2 may be spaced apart from the first semiconductor pattern SP1 included in the second stack structure ST2 and adjacent to the first stack structure ST by a sixth distance DS6 in the third direction D3. The first semiconductor patterns SP1 adjacent to each other in the third direction D3 of the first stack structure ST1 or the second stack structure ST2 may be spaced apart from each other by a seventh distance DS7. The seventh distance DS7 may be smaller than the sixth distance DS6. Other structures may be the same/similar to those described above.

Figure 18A:
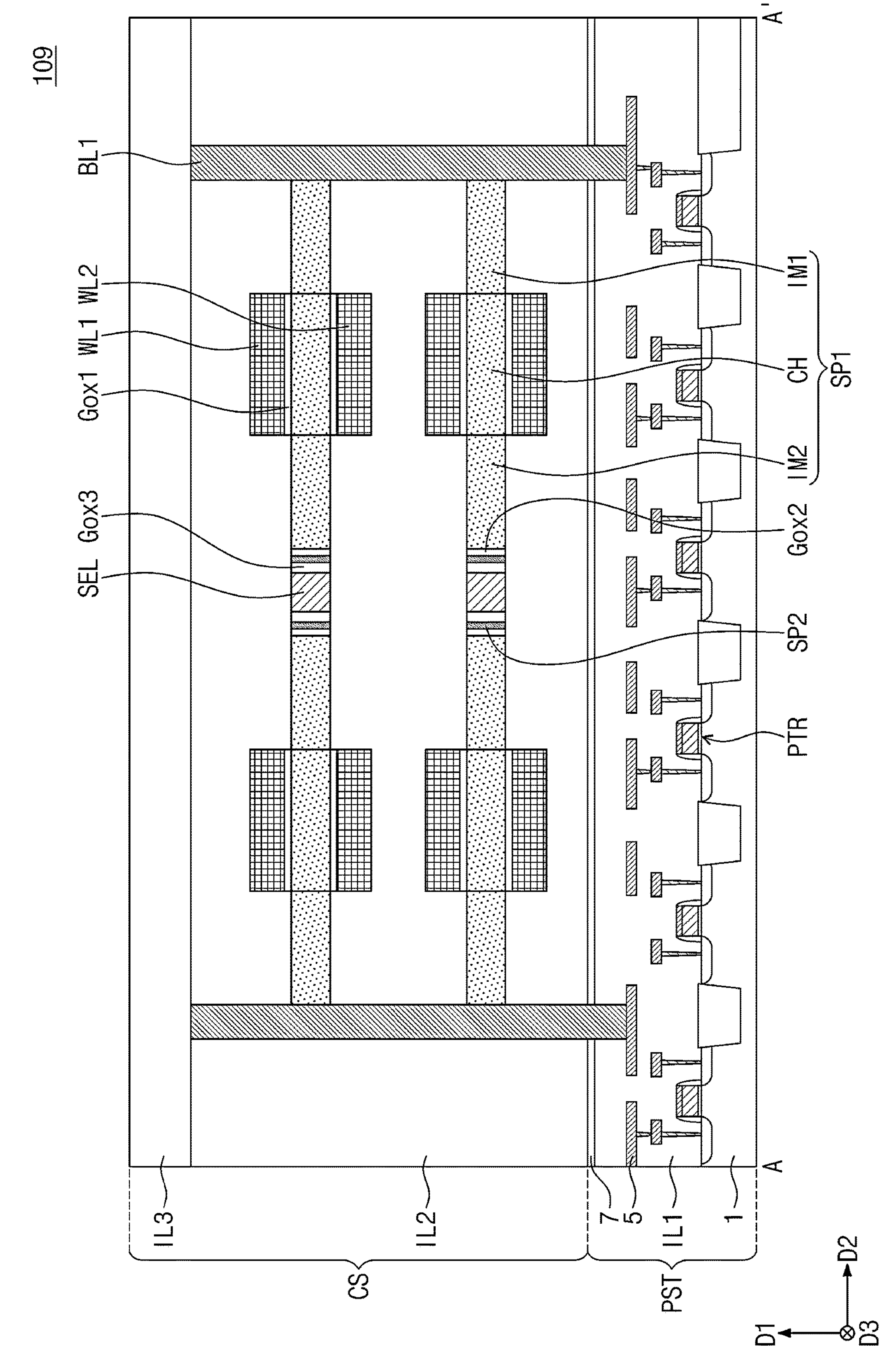
FIG. 18A is a cross-sectional view taken along line A-A' in FIG. 17A or 17B.
Figure 18B:
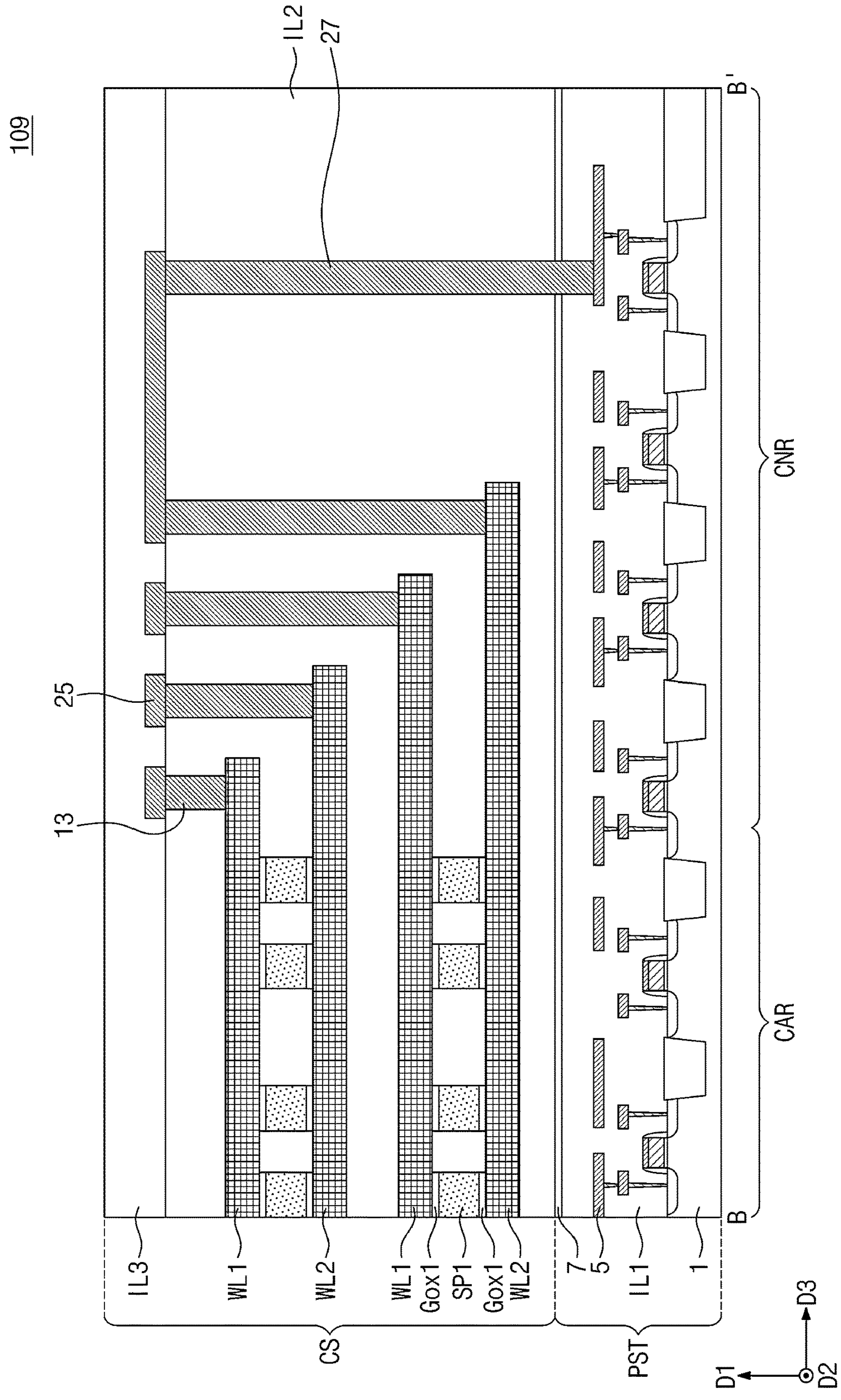
FIG. 18B is a cross-sectional view taken along line B-B' in FIG. 17A or 17B.

FIG. 18A is a cross-sectional view taken along line A-A' in FIG. 17A or 17B. FIG. 18B is a cross-sectional view taken along line B-B' in FIG. 17A or 17B.

Referring to FIG. 18B, the three-dimensional semiconductor memory device 109 according to the present embodiment may include a peripheral circuit structure PST and a cell stack CS disposed thereon. The peripheral circuit structure PST may include a substrate 1, peripheral transistors PTR disposed thereon, and a peripheral interlayer insulating layer IL1 covering the substrate 1 and the peripheral transistors PTR. Peripheral wirings 5 may be disposed in the peripheral interlayer insulating layer IL1 and may be connected to the peripheral transistors PTR. The peripheral transistors PTR and the peripheral wirings 5 may configure peripheral circuits such as a sub-word line driver, a sense amplifier, a row decoder, and/or a column decoder. The peripheral circuits may apply electrical signals to first bit lines BL1, second bit lines BL2, source lines SCL, selection lines SEL, first word lines WL1, and second word lines WL2, respectively. As used herein, the term "and/or" includes any and all combinations of one or more of the associated listed items.

The peripheral interlayer insulating layer IL1 may have a single layer or multilayer structure of at least one of silicon oxide, silicon nitride, silicon oxynitride, and porous insulator. An etch stop layer 7 may be disposed on the peripheral interlayer insulating layer IL1. The etch stop layer 7 may also be referred to as an 'interface layer'. The etch stop layer 7 may have a single layer structure or a multilayer structure of at least one of silicon oxide, silicon nitride, and silicon oxynitride. The substrate 1 may include a cell array region CAR and a connection region CNR. The cell stack CS includes a first cell interlayer insulating layer IL2 and a second cell interlayer insulating layer IL3.

The cell stack CS on the cell array region CAR will be described with reference to FIGS. 17A and 17B, and may include a first stack structure ST1 and a second stack structure ST2 disposed in the first cell interlayer insulating layer IL2. The first bit lines BL1, the second bit lines BL2, and the source lines SCL may partially penetrate the first cell interlayer insulating layer IL2, the etch stop layer 7, and the peripheral interlayer insulating layer IL1 to be in contact with the peripheral wirings 5.

Ends of the first and second word lines WL1 and WL2 may form a stepped shape on the connection region CNR. Although not shown, ends of the selection lines SEL may also form a stepped shape on the connection region CNR. Cell contacts 13 are disposed in the first cell interlayer insulating layer IL2 and connected to ends of the first and second word lines WL1 and WL2. Cell connection wirings 25 are disposed on the first cell interlayer insulating layer IL2. The second cell interlayer insulating layer IL3 covers the cell connection wirings 25. On the connection region CNR, a through-cell via 27 penetrates the first cell interlayer insulating layer IL2, the etch stop layer 7, and the peripheral interlayer insulating layer IL1 to connect one of the cell connection wirings 25 to one of the peripheral wirings 5. Other structures may be the same/similar to those described above.

Figure 19:
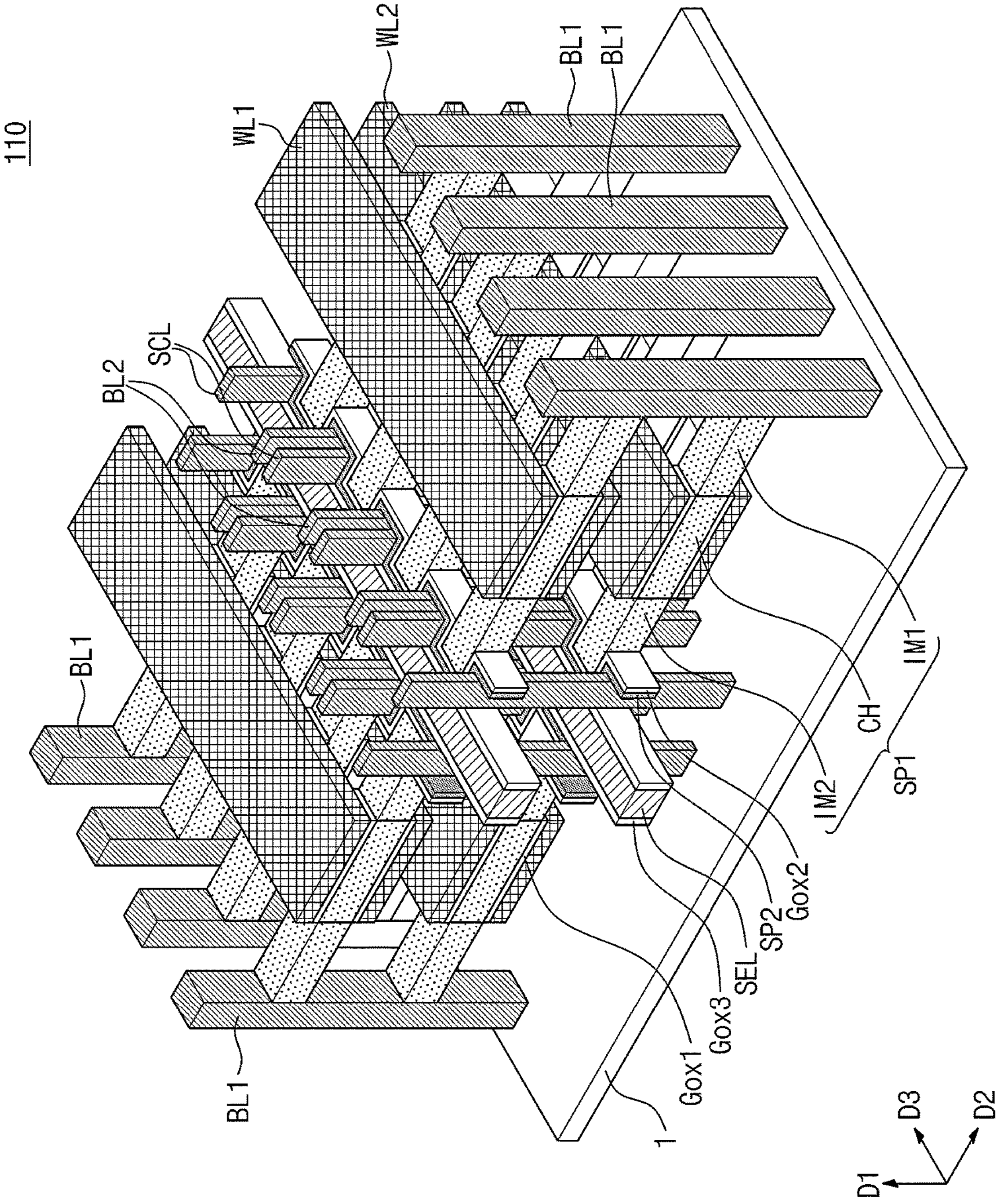
FIG. 19 is a perspective view of a three-dimensional semiconductor memory device according to some embodiments of the present invention.

FIG. 19 is a perspective view of a three-dimensional semiconductor memory device according to some embodiments of the present invention.

Referring to FIG. 19, a three-dimensional semiconductor memory device 110 according to the present embodiment has a structure in which the structure disclosed in FIG. 14 is repeatedly disposed in first and third directions D1 and D3. Memory cells positioned on the same level may share the selection line SEL positioned on the same level with each other. The second bit lines BL and the source lines SCL may be alternately arranged in a row in the third direction D3. Other structures may be the same/similar to those described above. In the three-dimensional semiconductor memory device 110 of FIG. 19, the second bit lines BL and the source lines SCL may be arranged as shown in FIG. 15.

Figure 20:
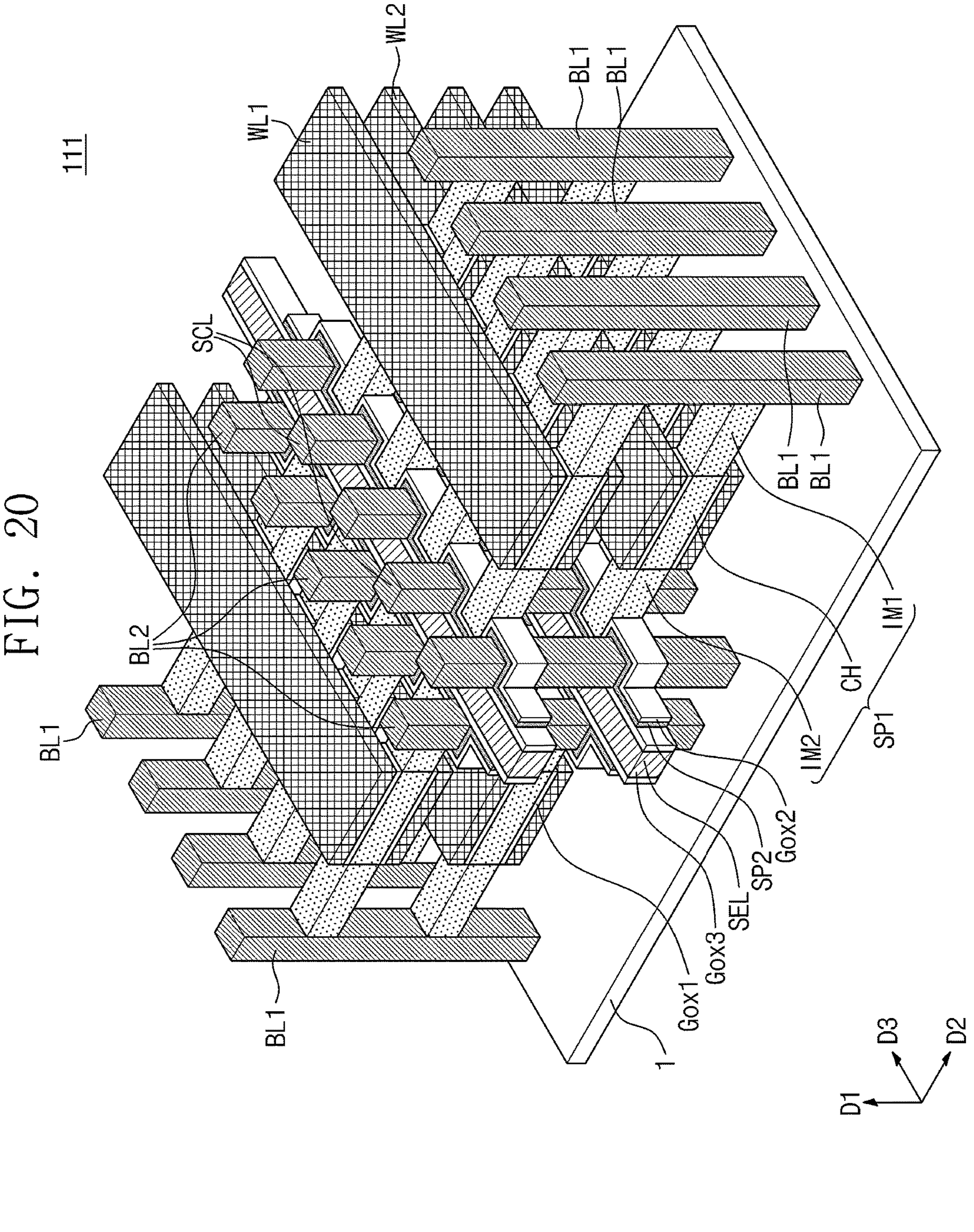
FIG. 20 is a perspective view of a three-dimensional semiconductor memory device according to some embodiments of the present invention.
Figure 21:
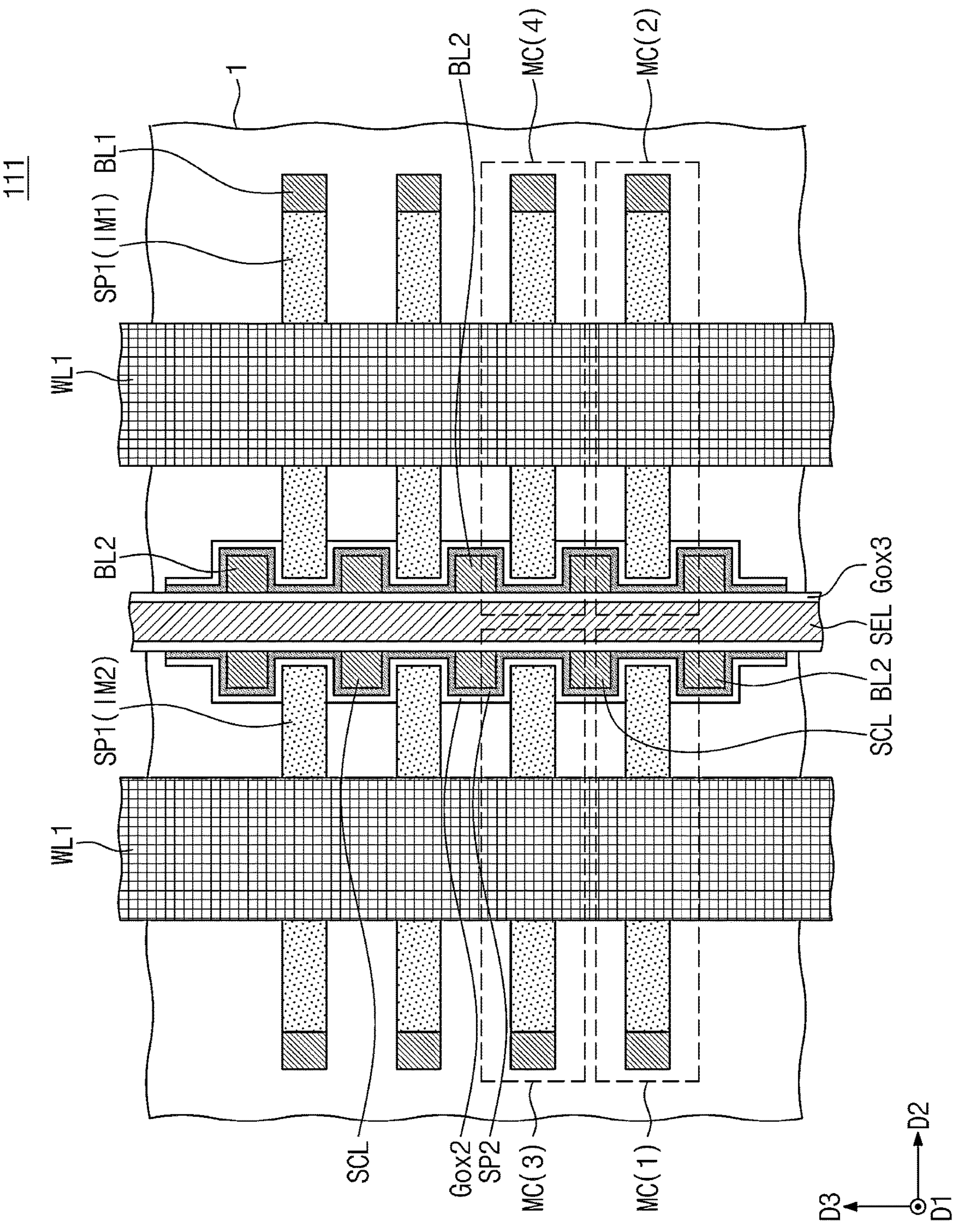
FIG. 21 is a plan view of the three-dimensional semiconductor memory device of FIG. 20.

FIG. 20 is a perspective view of a three-dimensional semiconductor memory device according to some embodiments of the present invention. FIG. 21 is a plan view of the three-dimensional semiconductor memory device of FIG. 20.

Referring to FIGS. 20 and 21, in a three-dimensional semiconductor memory device 111 according to the present embodiment, the second bit lines BL2 and the source lines SCL are alternately and repeatedly disposed in the third direction D3. The four memory cells MC(1) to MC(4) adjacent to each other on the same level may be disposed. The first and third memory cells MC(1) and MC(3) may have a mirror-symmetrical structure. The first and third memory cells MC(1) and MC(3) may share the source line SCL with each other. The second and fourth memory cells MC(2) and MC(4) may have a mirror-symmetrical structure. The second and fourth memory cells MC(2) and MC(4) may share the source line SCL with each other. The first and third memory cells MC(1) and MC(3) have a structure mirror-symmetrical to the second and fourth memory cells MC(2) and MC(4) in the second direction D2. The memory cells MC(1) to MC(4) at the same level may share one selection line SEL with each other. Other structures may be the same/similar to those described above. In some embodiments, the first and third memory cells MC(1) and MC(3) may be mirror-symmetric and the second and fourth memory cells MC(2) and MC(4) may be mirror-symmetric with respect to a plane (e.g., a plane defined by the first and second directions D1 and D2) that is perpendicular to the third direction D3, as illustrated in FIGS. FIGS. 20 and 21. In some embodiments, the first and second memory cells MC(1) and MC(2) may be mirror-symmetric and the third and fourth memory cells MC(3) and MC(4) may be mirror-symmetric with respect a plane (e.g., a plane defined by the first and third directions D1 and D3) that is perpendicular to the second direction D2, as illustrated in FIGS. FIGS. 20 and 21.

Figure 22:
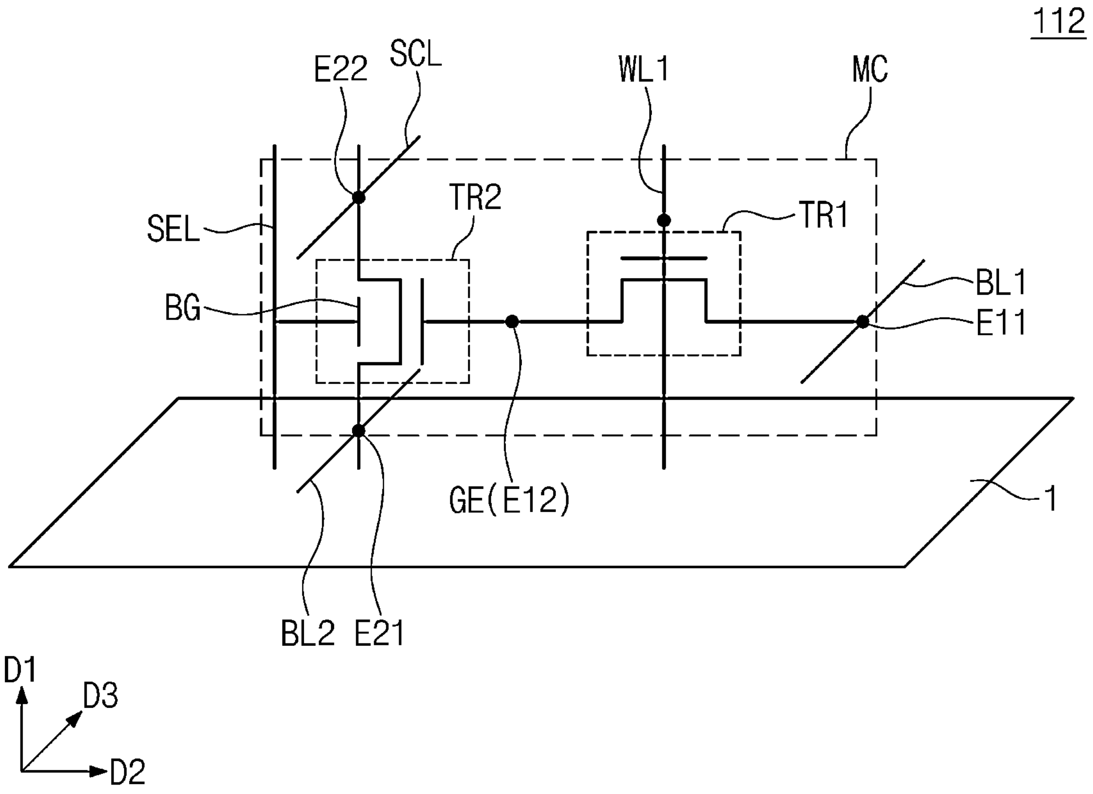
FIG. 22 is a circuit diagram of a three-dimensional semiconductor memory device according to some embodiments of the present invention.
Figure 23:
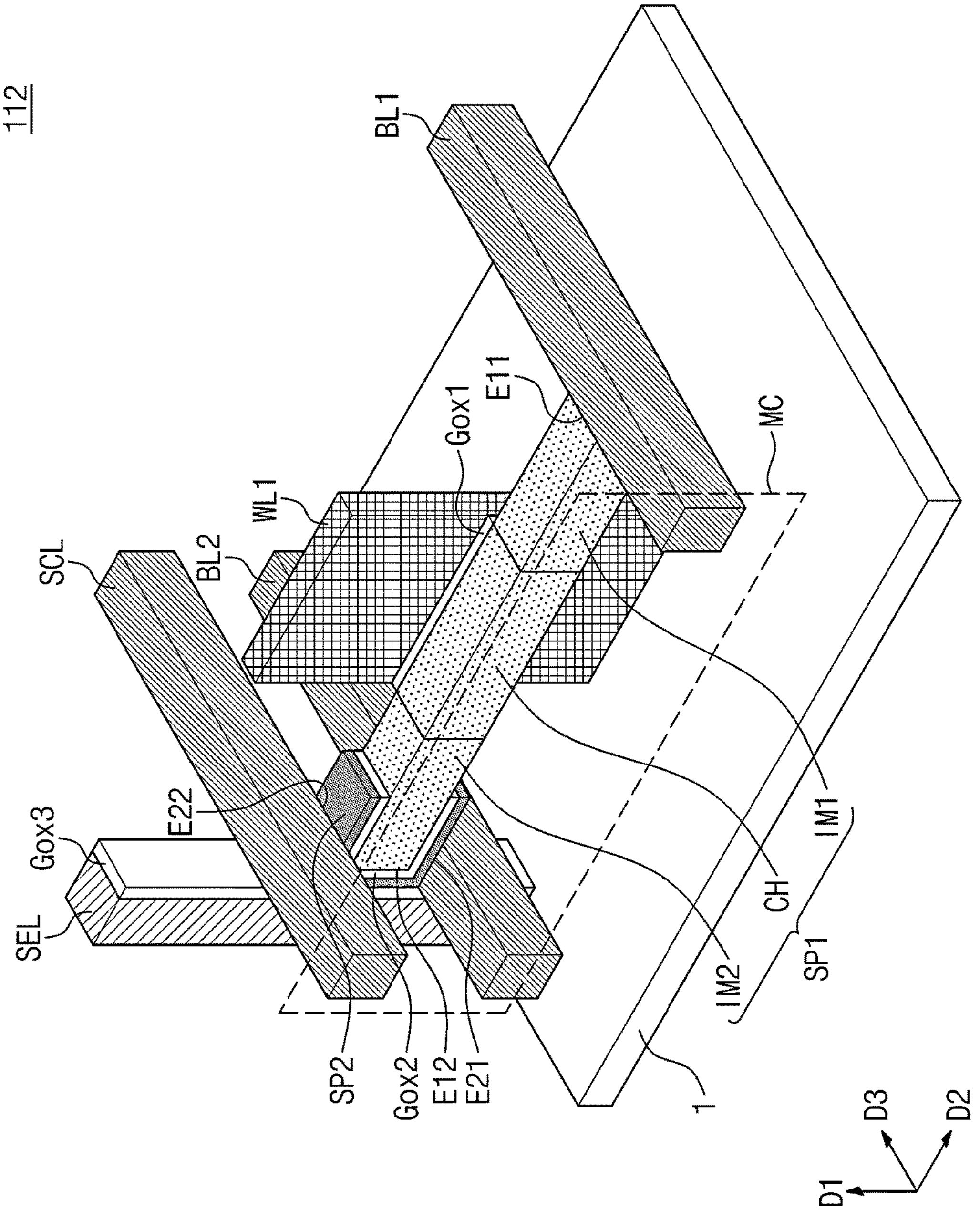
FIG. 23 is a perspective view of a three-dimensional semiconductor memory device having the circuit diagram of FIG. 22.

FIG. 22 is a circuit diagram of a three-dimensional semiconductor memory device according to some embodiments of the present invention. FIG. 23 is a perspective view of a three-dimensional semiconductor memory device having the circuit diagram of FIG. 22.

Referring to FIGS. 22 and 23, a three-dimensional semiconductor memory device 112 according to the present embodiment may have a structure in which the three-dimensional semiconductor memory device 100 described with reference to FIGS. 1 to 3 is rotated by 90 degrees such that the first word line WL1 is perpendicular to an upper surface of the substrate 1. In detail, the three-dimensional semiconductor memory device 112 includes memory cells MC disposed on the substrate 1. The substrate 1 may be, for example, a silicon single crystal wafer or a silicon on insulator (SOI) substrate. Although not shown, a plurality of transistors and wirings may be disposed on the substrate 1. The substrate 1 may be covered with an insulating layer.

One memory cell MC may include a first transistor TR1 and a second transistor TR2 connected thereto. The first transistor TR1 may be referred to as a write transistor. The first transistor TR1 may include a first terminal E11 and a second terminal E12 opposite to each other. The first terminal E11 of the first transistor TR1 is connected to the first bit line BL1. The first bit line BL1 extends in a third direction D3 parallel to the upper surface of the substrate 1. The second terminal E12 of the first transistor TR1 may be connected to a gate GE of the second transistor TR2. Alternatively, the second terminal E12 of the first transistor TR1 may function as a gate GE of the second transistor TR2. The first bit line BL1 may include a conductive material such as polysilicon doped with impurities, tungsten, aluminum, copper, titanium, iridium, or ruthenium.

A sidewall of the first bit line BL1 is in contact with the first semiconductor pattern SP1. The first semiconductor pattern SP1 may be formed of silicon, germanium, an oxide semiconductor material, or a two-dimensional semiconductor material. The oxide semiconductor material may include at least one of indium (In), gallium (Ga), zinc (Zn), and tin (Sn). The oxide semiconductor material may be indium-gallium-zinc-oxide (IGZO) containing indium (In), gallium (Ga), and zinc (Zn). The two-dimensional semiconductor material may include a transition metal and a chalcogen element. The transition metal may be, for example, tungsten (W) or molybdenum (Mo). The chalcogen element may be, for example, sulfur (S), selenium (Se) or tellurium (Te). The two-dimensional semiconductor material may be $MoS_2$, $WS_2$, $MoSe_2$ or $WSe_2$.

The first semiconductor pattern SP1 may have a bar shape elongated in the second direction D2 parallel to the upper surface of the substrate 1. The first semiconductor pattern SP1 may include a channel region CH and a first source/drain region IM1 and a second source/drain region IM2 respectively disposed on both sides of the channel region CH. The channel region CH may have a first conductivity type. The first source/drain region IM1 and the second source/drain region IM2 may have a second conductivity type opposite to the first conductivity type. The first source/drain region IM1 and the second source/drain region IM2 may be doped with impurities having the second conductivity type.

The first semiconductor pattern SP1 includes a first end E11 and a second end E12 opposite to each other. The first end E11 of the first semiconductor pattern SP1 may be in contact with a sidewall of the first bit line BL1 and may correspond to the first terminal E11 of the first transistor TR1. The second end E12 of the first semiconductor pattern SP1 may correspond to the second terminal E12 of the first transistor TR1. The second end E12 of the first semiconductor pattern SP1 or the second source/drain region IM2 may serve as a gate GE of the second transistor TR2. Charges may be stored in the second end E12 of the first semiconductor pattern SP1 or the second source/drain region IM2 as a storage node. When the first semiconductor pattern SP1 is formed of an oxide semiconductor material, leakage current is relatively small, thereby easily storing charge.

The first word line WL1 is adjacent to a back side of the first semiconductor pattern SP1. The first word line WL1 may extend in a first direction D1 perpendicular to the upper surface of the substrate 1. The third direction D3 may be parallel to the upper surface of the substrate 1. The first gate insulating layer Gox1 may be interposed between the first word line WL1 and the first semiconductor pattern SP1. A portion of the first word line WL1 may correspond to a gate of the first transistor TR1.

A selection line SEL is adjacent to the second end E12 of the first semiconductor pattern SP1. The selection line SEL may extend in the first direction D1. A second semiconductor pattern SP2 is interposed between the selection line SEL and the second end E12 of the first semiconductor pattern SP1. A second gate insulating layer Gox2 is interposed between the second semiconductor pattern SP2 and the second end E12 of the first semiconductor pattern SP1. A third gate insulating layer Gox3 is interposed between the second semiconductor pattern SP2 and the selection line SEL. A portion of the selection line SEL may serve as a back gate BG of the second transistor TR2.

The second semiconductor pattern SP2 has a first end E21 and a second end E22 opposite to each other. The first end E21 of the second semiconductor pattern SP2 is in contact with the second bit line BL2. The second end E22 of the second semiconductor pattern SP2 is in contact with the source line SCL. The second bit line BL2 and the source line SCL may extend in the third direction D3. The third gate insulating layer Gox3 may extend along a side of the selection line SEL and may be interposed between the selection line SEL and the second bit line BL2 and between the selection line SEL and the source line SCL. The second bit line BL2 may be disposed below the first semiconductor pattern SP1, and the source line SCL may be disposed above the first semiconductor pattern SP1.

The second semiconductor pattern SP2 may be formed of silicon, germanium, an oxide semiconductor material, or a two-dimensional semiconductor material. Preferably, the second semiconductor pattern SP2 may be formed of silicon, germanium, or silicon germanium having relatively high charge mobility.

The second semiconductor pattern SP2 and the second gate insulating layer Gox2 may be interposed between a lower surface of the first semiconductor pattern SP1 and the second bit line BL2 and between an upper surface of the first semiconductor pattern SP1 and the source line SCL.

Although one memory cell MC is shown in the three-dimensional semiconductor memory device 112 according to FIGS. 22 and 23, the memory cell MC may be alternately and/or repeatedly arranged in the first to the third directions D1, D2, and D3 to form a memory cell array. An operation of the three-dimensional semiconductor memory device 112 according to FIGS. 22 and 23 may be the same as/similar to that described with reference to FIGS. 7A to 7C.

Figure 24:
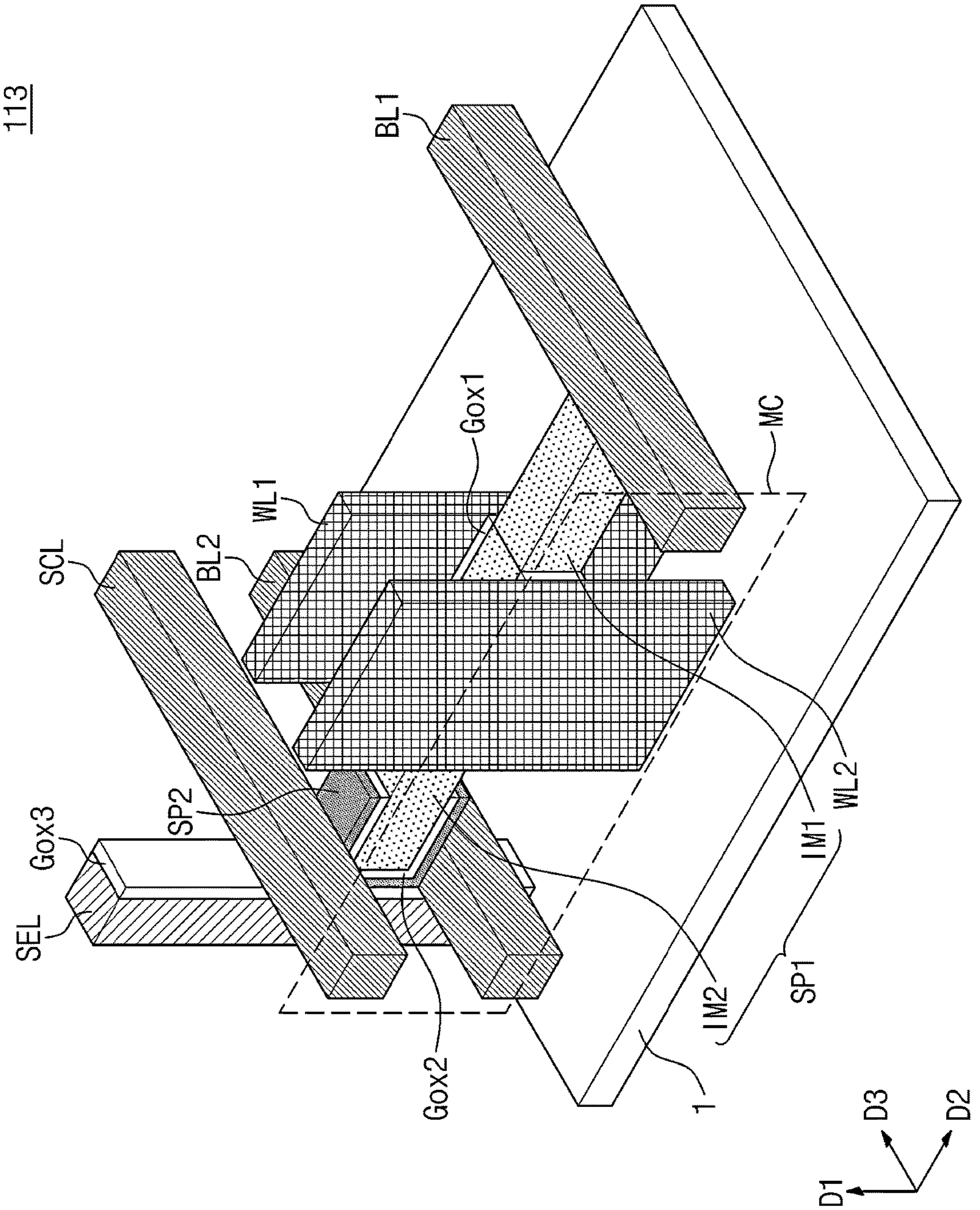
FIG. 24 is a perspective view of a three-dimensional semiconductor memory device according to some embodiments of the present invention.

FIG. 24 is a perspective view of a three-dimensional semiconductor memory device according to some embodiments of the present invention.

Referring to FIG. 24, a memory cell MC of the three-dimensional semiconductor memory device 113 according to the present embodiment further includes a second word line WL2 opposite to the first word line WL1. A first gate insulating layer Gox1 may be interposed between the second word line WL2 and the first semiconductor pattern SP1. The second word line WL2 may be adjacent to a front side of the first semiconductor pattern SPL. A channel region CH of the first semiconductor pattern SP1 may be disposed between the second word line WL2 and the first word line WL1. The same voltage as that of the first word line WL1 may be applied to the second word line WL2. Alternatively, a voltage different from that of the first word line WL1 may be applied to the second word line WL2. The second word line WL2 may serve as a back gate in the first transistor TR1. Other structures may be the same/similar to those described above.

Figure 25:
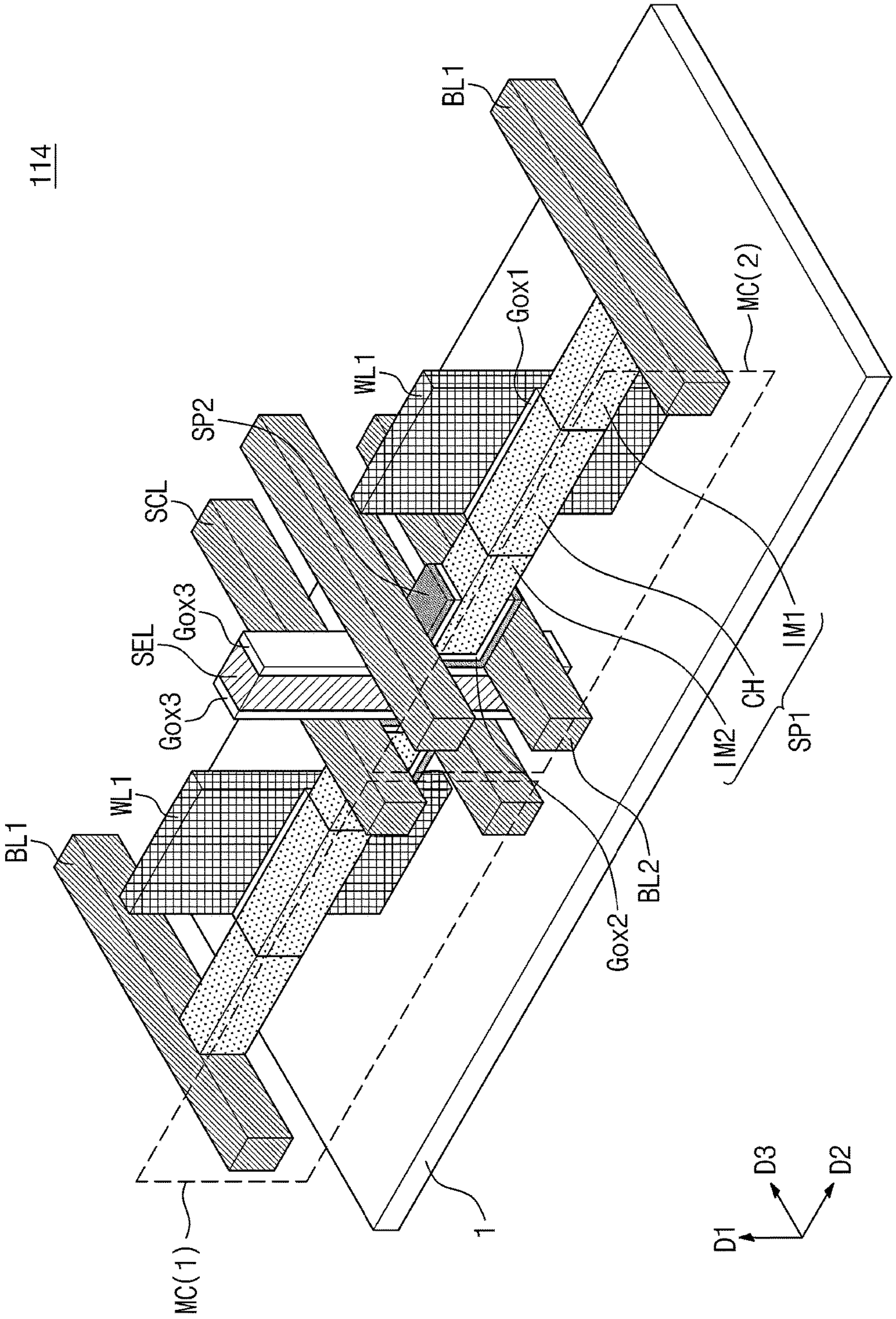
FIG. 25 is a perspective view of a three-dimensional semiconductor memory device according to some embodiments of the present invention.

FIG. 25 is a perspective view of a three-dimensional semiconductor memory device according to some embodiments of the present invention.

Referring to FIG. 25, in a three-dimensional semiconductor memory device 114 according to the present embodiment, first and second memory cells MC(1) and MC(2) are disposed side by side in the second direction D2 on the substrate 1. The first and second memory cells MC(1) and MC(2) share a selection line SEL disposed therebetween. The second memory cell MC(2) may have the structure described with reference to FIGS. 22 and 23. The first and second memory cells MC(1) and MC(2) may have a mirror-symmetric structure with each other in the second direction D2. Other structures may be the same/similar to those described above. In some embodiments, the first and second memory cells MC(1) and MC(2) may be mirror-symmetric with respect to a plane (e.g., a plane defined by the first and third directions D1 and D3) that is perpendicular to the second direction D2, as illustrated in FIG. 25.

Figure 26:
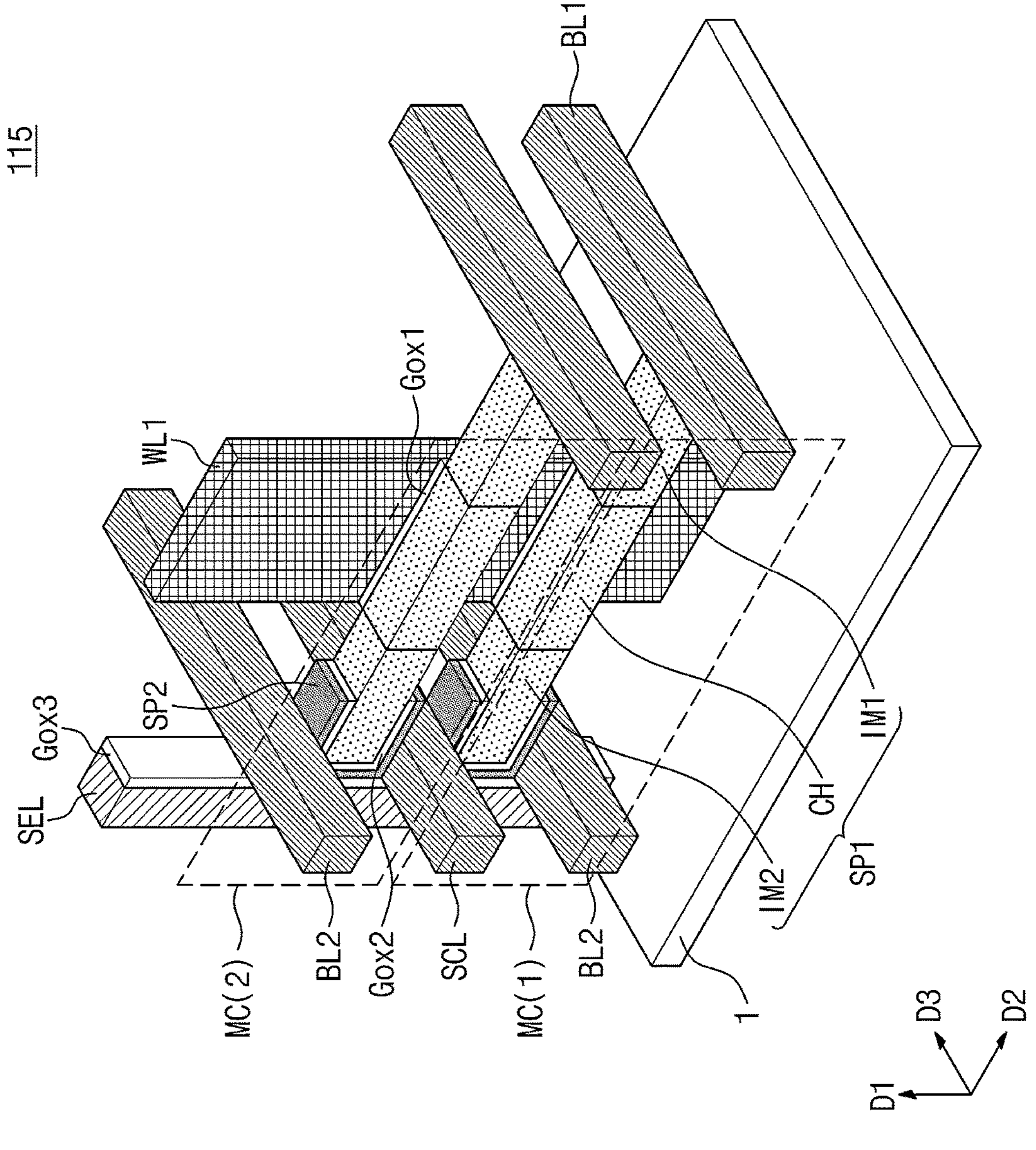
FIG. 26 is a perspective view of a three-dimensional semiconductor memory device according to some embodiments of the present invention.

FIG. 26 is a perspective view of a three-dimensional semiconductor memory device according to some embodiments of the present invention.

Referring to FIG. 26, in a three-dimensional semiconductor memory device 115 according to the present embodiment, first and second memory cells MC(1) and MC(2) are disposed side by side in the first direction D1 on the substrate 1. The first and second memory cells MC(1) and MC(2) share the selection line SEL with each other. The first and second memory cells MC(1) and MC(2) share a source line SCL disposed therebetween. The first memory cell MC(1) may have the structure described with reference to FIGS. 22 and 23. The first and second memory cells MC(1) and MC(2) may have a mirror-symmetric structure with each other in the first direction D1. Other structures may be the same/similar to those described above. In some embodiments, the first and second memory cells MC(1) and MC(2) may be mirror-symmetric with respect to a plane (e.g., a plane defined by the second and third directions D2 and D3) that is perpendicular to the first direction D1, as illustrated in FIG. 26.

Figure 27:
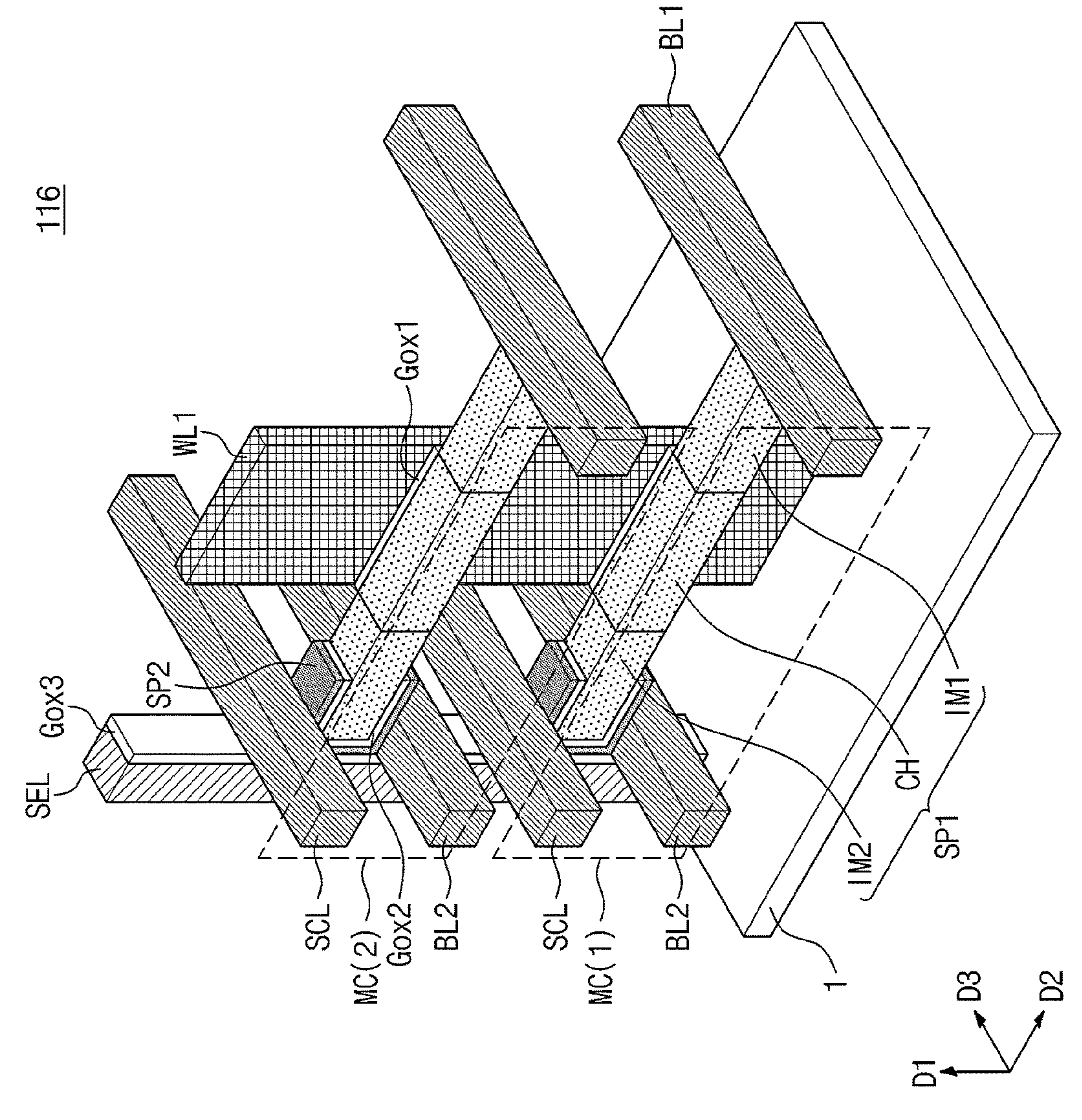
FIG. 27 is a perspective view of a three-dimensional semiconductor memory device according to some embodiments of the present invention.

FIG. 27 is a perspective view of a three-dimensional semiconductor memory device according to some embodiments of the present invention.

Referring to FIG. 27, in a three-dimensional semiconductor memory device 116 according to the present embodiment, first and second memory cells MC(1) and MC(2) are disposed side by side in the first direction D1 on the substrate 1. The first and second memory cells MC(1) and MC(2) share the selection line SEL with each other. The first and second memory cells MC(1) and MC(2) may include a first bit line BL1, a second bit line BL2, and a source line SCL separated from each other. Other structures may be the same/similar to those described above.

Figure 28:
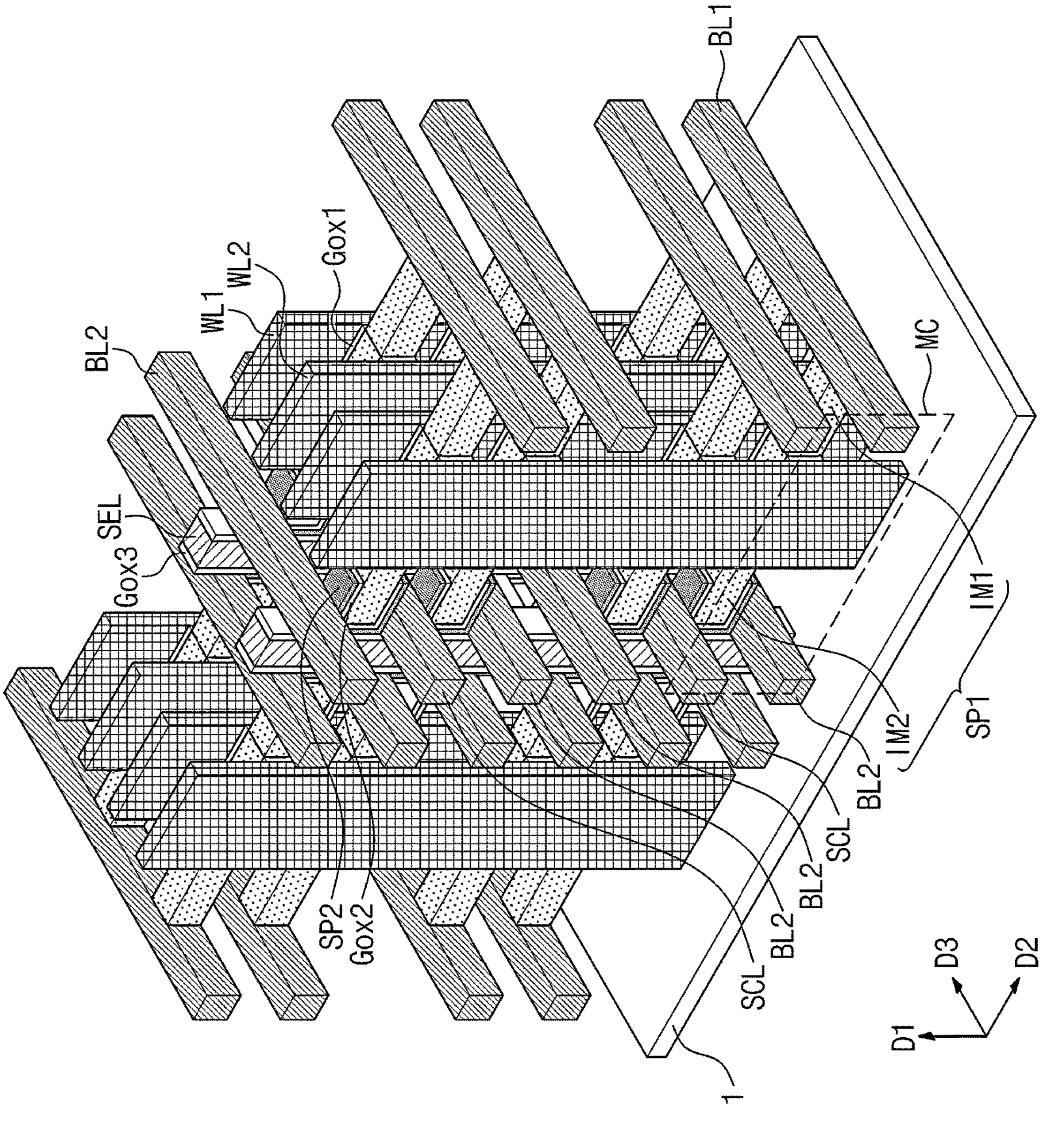
FIG. 28 is a perspective view of a three-dimensional semiconductor memory device according to some embodiments of the present invention.

FIG. 28 is a perspective view of a three-dimensional semiconductor memory device according to some embodiments of the present invention.

Referring to FIG. 28, in a three-dimensional semiconductor memory device 117 according to the present embodiment, memory cells MC may have a memory cell array structure in which memory cells MC are repeatedly disposed in the first to third directions D1, D2, and D3. The three-dimensional semiconductor memory device 117 of FIG. 28 may have a structure in which the embodiments of FIGS. 22 to 26 are combined. In this example, the first bit lines BL1, the second bit lines BL2, and the source lines SCL may extend in the third direction D3 and may be stacked in the first direction D1. Ends of the first bit lines BL1, the second bit lines BL2, and the source lines SCL may have a stepped shape like the ends of the first and second word lines WL1 and WL2 of FIG. 18B and may be connected to the cell contacts 13. The first and second word lines WL1 and WL2 and the selection lines SEL may extend in a first direction D1 perpendicular to the upper surface of the substrate 1 and may be arranged in the third direction D3 and the second direction D2. Similar to the first bit lines BL1 of FIG. 18A, the selection lines SEL may partially penetrate the first cell interlayer insulating layer IL2, the etch stop layer 7, and the peripheral interlayer insulating layer IL5 to come into partial contact with the peripheral wirings 5. Other structures may be the same/similar to those described above.

As described above, according to some embodiments of the present invention, the three-dimensional semiconductor memory devices having various three-dimensional structures may be provided. In the three-dimensional semiconductor memory device according to some embodiments of the present invention, density (e.g., integration density) of memory cells may increase, thereby providing a high-capacity memory.

The three-dimensional semiconductor memory device according to some embodiments of the present invention has the memory cell structure suitable for the three-dimensional arrangement. In addition, the three-dimensional semiconductor memory device may not include a capacitor, and thus the size may be reduced. As a result, it may be easy to increase the density of the memory cells to implement the three-dimensional semiconductor memory device having the high-capacity memory. According to the present invention, the selection line serving as the back gate may be connected to the second transistor of the memory cell to provide the three-dimensional semiconductor memory device with the improved reliability.

Although terms (e.g., first, second or third) may be used herein to describe various elements, these elements should not be limited by these terms. These terms are only used to distinguish one element from another. For example, a first element may be referred to as a second element, and, similarly a second element may be referred to as a first element without departing from the teachings of the disclosure.

It is noted that aspects of the invention described with respect to one embodiment, may be incorporated in a different embodiment although not specifically described relative thereto. That is, all embodiments and/or features of any embodiment can be combined in any way and/or combination While some example embodiments are described above, a person skilled in the art may understand that many modifications and variations are made without departing from the spirit and scope of the present invention defined in the following claims. Accordingly, the example embodiments of the present disclosure discussed herein should be considered in all respects as illustrative and not restrictive, with the scope of the present invention being indicated by the appended claims.

What is claimed is:

1. A three-dimensional semiconductor memory device comprising:

a first bit line extending longitudinally in a first direction that is perpendicular to an upper surface of a substrate;

a first semiconductor pattern extending longitudinally in a second direction parallel to the upper surface of the substrate and comprising a first end and a second end opposite to each other, the first end of the first semiconductor pattern being in contact with the first bit line;

a first word line that is on a middle portion of the first semiconductor pattern in the second direction and extends longitudinally in a third direction crossing the second direction and parallel to the upper surface of the substrate;

a selection line adjacent to the second end of the first semiconductor pattern and parallel to the third direction;

a second semiconductor pattern that is between the selection line and the first semiconductor pattern and comprises a first end and a second end opposite to each other;

a second bit line extending longitudinally in the first direction and being in contact with the first end of the second semiconductor pattern; and a source line extending longitudinally in the first direction and being in contact with the second end of the second semiconductor pattern.

2. The three-dimensional semiconductor memory device of claim 1, further comprising a second word line extending longitudinally in the third direction, wherein the middle portion of the first semiconductor pattern is between the first word line and the second word line, and wherein different voltages are configured to be applied to the first word line and the second word line.

3. The three-dimensional semiconductor memory device of claim 1, wherein the first word line extends around side surfaces and a lower surface of the first semiconductor pattern.

4. The three-dimensional semiconductor memory device of claim 1, further comprising:

a first gate insulating layer between the first word line and the first semiconductor pattern;

a second gate insulating layer between the first semiconductor pattern and the second semiconductor pattern; and a third gate insulating layer between the selection line and the second semiconductor pattern.

5. The three-dimensional semiconductor memory device of claim 4, further comprising:

a first impurity region that is in the first semiconductor pattern and is in contact with the first bit line; and a second impurity region that is in the first semiconductor pattern and is in contact with the second gate insulating layer.

6. The three-dimensional semiconductor memory device of claim 5, wherein the second impurity region configured to function as a storage node or a gate electrode.

7. The three-dimensional semiconductor memory device of claim 1, wherein the second semiconductor pattern is between the first semiconductor pattern and the second bit line and is between the first semiconductor pattern and the source line.

8. The three-dimensional semiconductor memory device of claim 1, wherein the first semiconductor pattern, the first word line, the selection line, and the second semiconductor pattern constitute a first structure, and wherein the three-dimensional semiconductor memory device comprises a plurality of first structures, and the plurality of first structures are stacked and spaced apart from each other in the first direction and are electrically connected to the first bit line, the second bit line, and the source line.

9. The three-dimensional semiconductor memory device of claim 1, wherein the first bit line, the first semiconductor pattern, the first word line, the second semiconductor pattern, the second bit line, and the source line constitute a first structure, and wherein the three-dimensional semiconductor memory device comprises two first structures, and the two first structures are in mirror symmetry with respect to the selection line.

10. The three-dimensional semiconductor memory device of claim 1, further comprising:

a third bit line spaced apart from the second bit line, the source line being between the third bit line and the second bit line;

a third semiconductor pattern that is between the third bit line and the source line and extends longitudinally in the second direction; and a fourth bit line in contact with a first end of the third semiconductor pattern and spaced apart from the first bit line in the third direction, wherein the first word line is adjacent to an upper surface of the third semiconductor pattern, wherein the selection line is adjacent to a second end of the third semiconductor pattern, and the second end of the third semiconductor pattern is opposite to the first end of the third semiconductor pattern, and wherein the second semiconductor pattern extends into a space between the selection line and the second end of the third semiconductor pattern.

11. The three-dimensional semiconductor memory device of claim 1, wherein the first bit line has a first width in the third direction, wherein each of the second bit line and the source line has a second width in the third direction, and wherein the first width is greater than the second width.

12. The three-dimensional semiconductor memory device of claim 1, wherein the first semiconductor pattern includes an oxide semiconductor or a two-dimensional semiconductor material, and wherein the second semiconductor pattern includes a silicon layer.

13. The three-dimensional semiconductor memory device of claim 1, wherein a lower surface of the first word line farther than an upper surface of the selection line from the substrate.

14. The three-dimensional semiconductor memory device of claim 1, further comprising a third semiconductor pattern and a fourth semiconductor pattern sequentially stacked in the third direction and spaced apart from the first semiconductor pattern, wherein the third semiconductor pattern and the fourth semiconductor pattern each extends longitudinally in the second direction, wherein the first word line extends onto upper surfaces of the third semiconductor pattern and the fourth semiconductor pattern, wherein the first semiconductor pattern is spaced apart from the third semiconductor pattern in the third direction by a first distance, and wherein the third semiconductor pattern is spaced apart from the fourth semiconductor pattern in the third direction by a second distance longer than the first distance.

15. The three-dimensional semiconductor memory device of claim 1, further comprising:

a third semiconductor pattern and a fourth semiconductor pattern that are connected to the first bit line, are sequentially stacked in the first direction and are spaced apart from the first semiconductor pattern;

a second word line that is under the third semiconductor pattern, is spaced apart from the first word line and extends longitudinally in the third direction; and a third word line that is on the fourth semiconductor pattern and extends longitudinally in the third direction, wherein the first semiconductor pattern is spaced apart from the third semiconductor pattern in the first direction by a first distance, and wherein the third semiconductor pattern is spaced apart from the fourth semiconductor pattern in the first direction by a second distance shorter than the first distance.

16. A three-dimensional semiconductor memory device comprising:

a first bit line extending longitudinally in a first direction that is perpendicular to an upper surface of a substrate;

first and second semiconductor patterns that are in contact with a side surface of the first bit line, are spaced apart from each other in the first direction and extends longitudinally in a second direction that is parallel to the upper surface of the substrate, each of the first and second semiconductor patterns comprising a first end in contact with the first bit line and a second end opposite to the first end;

a first word line adjacent to an upper surface of the first semiconductor pattern and extending longitudinally in a third direction crossing the first and second directions;

a second word line adjacent to an upper surface of the second semiconductor pattern and extending longitudinally in the third direction;

a first selection line adjacent to the second end of the first semiconductor pattern and extending longitudinally in the third direction;

a second selection line adjacent to the second end of the second semiconductor pattern and extending longitudinally in the third direction;

a third semiconductor pattern between the first semiconductor pattern and the first selection line;

a fourth semiconductor pattern between the second semiconductor pattern and the second selection line;

a source line extending longitudinally in the first direction and in contact with first ends of the third and fourth semiconductor patterns; and a second bit line in contact with second ends of the third and fourth semiconductor patterns and extending longitudinally in the first direction.

17. The three-dimensional semiconductor memory device of claim 16, wherein, when a turn-off voltage is applied to the second word line and a turn-on voltage is applied to the first word line, a charge is configured to be stored in the second end of the first semiconductor pattern, and wherein, when a non-selection voltage is applied to the second selection line and a selection voltage is applied to the first selection line, a potential of the charge stored in the second end of the first semiconductor pattern is configured to be read.

18. The three-dimensional semiconductor memory device of claim 16, wherein the first bit line, the first semiconductor pattern, the first word line, the third semiconductor pattern, the second bit line, and the source line constitute a first structure, and wherein the three-dimensional semiconductor memory device comprises two first structures, and the two first structures are in mirror symmetry with respect to the first selection line.

19. The three-dimensional semiconductor memory device of claim 16, further comprising:

a third bit line spaced apart from the second bit line, the source line being between the third bit line and the second bit line;

a fifth semiconductor pattern that is between the third bit line and the source line and extends longitudinally in the second direction; and a fourth bit line in contact with a first end of the fifth semiconductor pattern and spaced apart from the first bit line in the third direction, wherein the first word line extends longitudinally in the third direction and is adjacent to an upper surface of the fifth semiconductor pattern, wherein the first selection line extends longitudinally in the third direction and is adjacent to a second end of the fifth semiconductor pattern, and the second end of the fifth semiconductor pattern is opposite to the first end of the fifth semiconductor pattern, and wherein the third semiconductor pattern extends into a space between the first selection line and the second end of the fifth semiconductor pattern.

20. A three-dimensional semiconductor memory device comprising:

a first bit line extending longitudinally in a first direction that is perpendicular to an upper surface of a substrate;

a first semiconductor pattern extending longitudinally in a second direction that is parallel to the upper surface of the substrate and comprising a first end and a second end opposite to each other, the first end of the first semiconductor pattern being in contact with the first bit line;

a first word line on a middle portion of the first semiconductor pattern and extending longitudinally in a third direction that crosses the second direction and is parallel to the upper surface of the substrate;

a selection line adjacent to the second end of the first semiconductor pattern and parallel to the third direction;

a second semiconductor pattern that is between the selection line and the first semiconductor pattern and comprises first and second ends opposite to each other;

a second bit line that extends longitudinally in the first direction and is in contact with the first end of the second semiconductor pattern; and a source line that is in contact with the second end of the second semiconductor pattern and extends longitudinally in the first direction, wherein the first bit line, the first semiconductor pattern, the first word line, the second semiconductor pattern, the second bit line, and the source line constitute a first structure, and wherein the three-dimensional semiconductor memory device comprises two first structures, and the two first structures are in mirror symmetry with respect to the selection line, and the two first structures share the selection line.

* * * * *